(12) United States Patent
Niide et al.

(10) Patent No.: US 9,070,614 B2
(45) Date of Patent: Jun. 30, 2015

(54) SEMICONDUCTOR DEVICE AND MANUFACTURING METHOD THEREOF

(71) Applicant: Renesas Electronics Corporation, Kanagawa (JP)

(72) Inventors: Ryo Niide, Kanagawa (JP); Shinichi Yamada, Kanagawa (JP); Yasuharu Ichinose, Kanagawa (JP); Toshiya Nozawa, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 13/900,716

(22) Filed: May 23, 2013

(65) Prior Publication Data

US 2013/0334562 A1 Dec. 19, 2013

(30) Foreign Application Priority Data

Jun. 14, 2012 (JP) ................. 2012-134796

(51) Int. Cl.
*H01L 33/62* (2010.01)
*H01L 29/866* (2006.01)
*H01L 33/36* (2010.01)
*H01L 27/15* (2006.01)
*H01L 25/16* (2006.01)
*H01L 23/00* (2006.01)
*H01L 33/48* (2010.01)

(52) U.S. Cl.
CPC ............... *H01L 27/15* (2013.01); *H01L 33/36* (2013.01); *H01L 25/167* (2013.01); *H01L 29/866* (2013.01); *H01L 33/486* (2013.01); *H01L 2224/32257* (2013.01); *H01L 24/32* (2013.01); *H01L 2224/32245* (2013.01); *H01L 2224/48091* (2013.01); *H01L 2224/48247* (2013.01); *H01L 2224/73265* (2013.01); *H01L 2924/07802* (2013.01); *H01L 2924/12041* (2013.01)

(58) Field of Classification Search
CPC ......... H01L 33/48; H01L 33/60; H01L 33/62; H01L 33/486; H01L 33/64; H01L 33/645; H01L 25/167; H01L 29/866
USPC ..................... 257/79–100, E33.055–E33.066
See application file for complete search history.

(56) References Cited

U.S. PATENT DOCUMENTS

| 7,394,108 | B2 | 7/2008 | Takeda et al. |
| 2006/0108597 | A1 | 5/2006 | Takeda et al. |
| 2009/0267096 | A1* | 10/2009 | Kim ............................. 257/98 |
| 2012/0043559 | A1* | 2/2012 | Hiramatsu ..................... 257/88 |

FOREIGN PATENT DOCUMENTS

| JP | H11-214747 | 8/1999 |
| JP | 2006-156440 | 6/2006 |

* cited by examiner

*Primary Examiner* — Matthew W Such
*Assistant Examiner* — Scott Stowe
(74) *Attorney, Agent, or Firm* — Young & Thompson

(57) ABSTRACT

A semiconductor device simplifies the manufacturing process. The device includes a protective chip which has a surface Zener diode to protect a light emitting chip with an LED formed therein from surge voltage. The protective chip is mounted over a wiring electrically coupled through a metal wire to an anode electrode coupled to a p-type semiconductor region whose conductivity type is the same as that of the semiconductor substrate of the chip. The anode electrode of the protective chip is electrically coupled to the back surface of the chip without PN junction, so even if the back surface is in contact with the wiring, no problem occurs with the electrical characteristics of the Zener diode. This eliminates the need to form an insulating film on the back surface of the chip to prevent contact between the back surface and the wiring, thus simplifying the manufacturing process.

12 Claims, 20 Drawing Sheets

FIG. 7
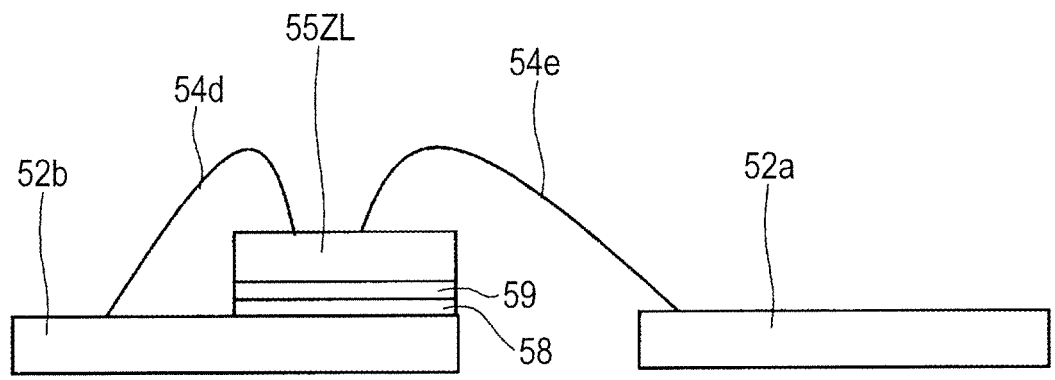
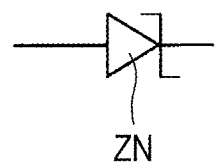
FIG. 8
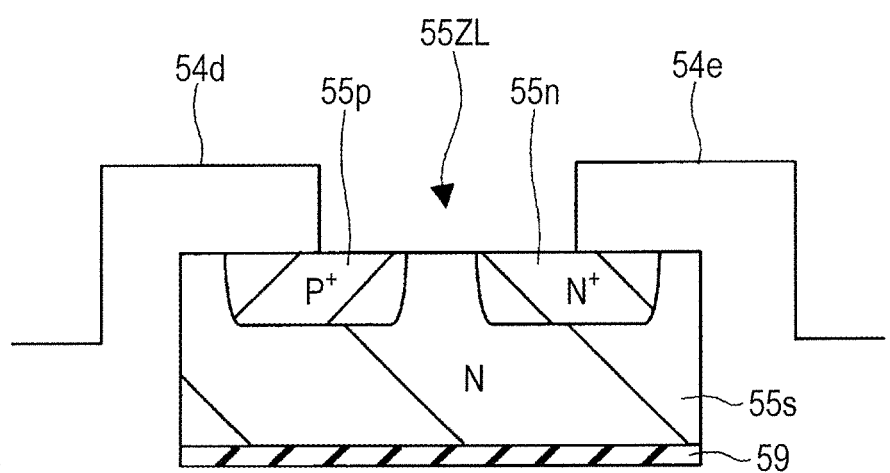

SEMICONDUCTOR DEVICE AND MANUFACTURING METHOD THEREOF

CROSS-REFERENCE TO RELATED APPLICATIONS

The disclosure of Japanese Patent Application No. 2012-134796 filed on Jun. 14, 2012 including the specification, drawings and abstract is incorporated herein by reference in its entirety.

BACKGROUND

The present invention relates to semiconductor devices and manufacturing methods thereof and more particularly to semiconductor devices with a protective diode for protection of electronic components against ESD (electrostatic discharge) and manufacturing methods thereof.

In some kinds of high-brightness LEDs (light emitting diodes), ESD surge tolerance is low and therefore a protective Zener diode must be used to absorb inrushing ESD surge from outside to prevent damage to the high-brightness LEDs.

Formerly, a high-brightness LED and a protective Zener diode were separately packaged. Recently, however, the tendency that a high-brightness LED and a protective Zener diode are packaged together for the sake of compactness has been growing (see Japanese Unexamined Patent Publication No. 2006-156440 and Japanese Unexamined Patent Publication No. Hei 11 (1999)-214747).

SUMMARY

Formerly, typical protective Zener diodes were of the vertical in which an anode electrode and a cathode electrode are located on the upper and lower surfaces of the chip. In recent years, from the viewpoints of packaging ease and reliability, the use of surface Zener diodes in which an anode electrode and a cathode electrode are located on the upper surface of the chip has been spreading. However, surface Zener diodes have a problem that an insulating film must be formed to prevent a contact failure on the back surface and the semiconductor device manufacturing process thus becomes more complicated.

The above and further objects and novel features of the invention will more fully appear from the following detailed description in this specification and the accompanying drawings.

SUMMARY

According to one aspect of the present invention, there is provided a semiconductor device in which a semiconductor chip having a surface protective diode to protect an electronic component electrically coupled between a first wiring and a second wiring isolated from each other electrically is mounted over the first wiring or second wiring which is electrically coupled to one electrode of a pair of electrodes of the protective diode. The electrode is electrically coupled to the back surface of the semiconductor chip without PN junction inside the semiconductor chip.

According to another aspect of the present invention, there is provided a method of manufacturing a semiconductor device which includes the step of mounting a semiconductor chip having a surface protective diode to protect an electronic component electrically coupled between a first wiring and a second wiring isolated from each other electrically, over the first or second wiring which is electrically coupled to one electrode of a pair of electrodes of the protective diode. The electrode is electrically coupled to the back surface of the semiconductor chip without PN junction inside the semiconductor chip.

According to the present invention, the process of manufacturing a semiconductor device is simplified.

BRIEF DESCRIPTION OF THE DRAWINGS

FIG. 7 is a side view of a surface protective chip conceived by the present inventors, which includes an insulating film for prevention of contact on its back surface;

FIG. 8 is an enlarged sectional view of the protective chip shown in FIG. 7;

DETAILED DESCRIPTION

Next, descriptions of the preferred embodiments will be made below in different sections or separately as necessary, but such descriptions are not irrelevant to each other unless otherwise specified. One description may be, in whole or in part, a modified, detailed or supplementary form of another description. Also, regarding the preferred embodiments described below, when a specific number (the number of pieces, numerical value, quantity, range, etc.) is indicated for an element, it is not limited to the specific number unless otherwise specified or theoretically limited to that number; it may be larger or smaller than the specific number. Furthermore, in the preferred embodiments described below, constituent elements (including constituent steps) are not necessarily essential unless otherwise specified or theoretically essential. Similarly, in the preferred embodiments described below, when a specific form or positional relation is indicated for an element, it should be interpreted to include a form or positional relation which is virtually equivalent or similar to the specific form or positional relation unless otherwise specified or theoretically limited to the specific form or positional relation. The same can be said of the numerical values and ranges, as mentioned above.

Next, the preferred embodiments will be described in detail referring to the accompanying drawings. In all the drawings that illustrate the preferred embodiments, elements with like functions are designated by like reference signs and repeated descriptions thereof are omitted. Regarding the preferred embodiments below, basically descriptions of the same or similar elements are not repeated except when necessary.

Regarding the drawings that illustrate preferred embodiments, hatching may be omitted even in a sectional view for easy understanding and hatching may be used even in a plan view for easy understanding.

First Embodiment

Figure 25:
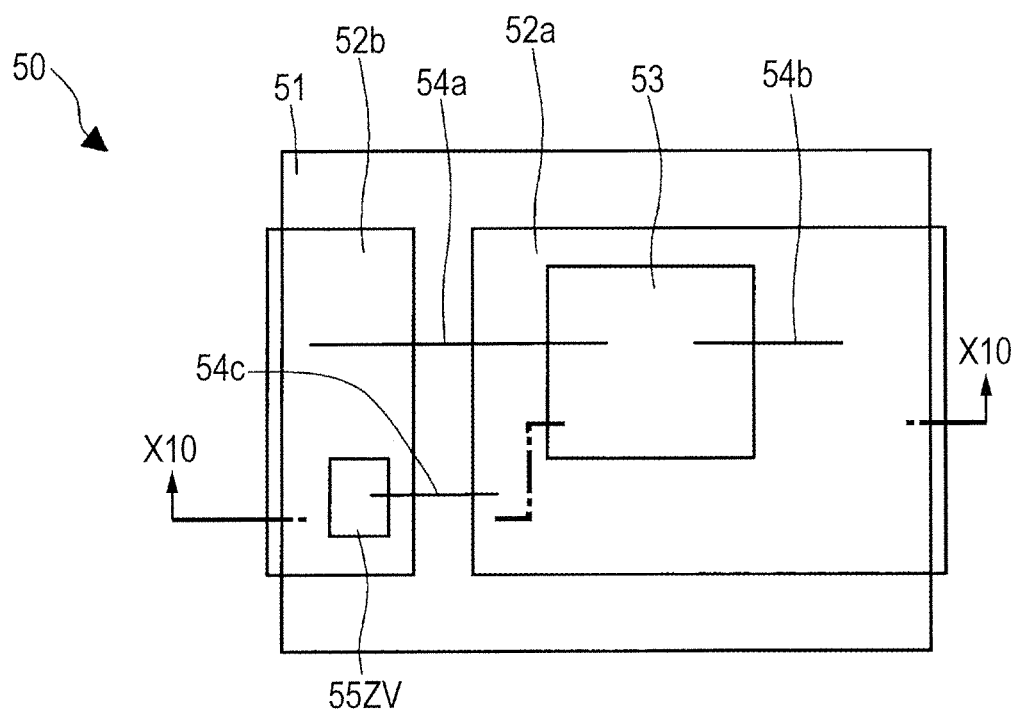
FIG. 25 is a plan view of an LED package conceived by the present inventors.
Figure 26:
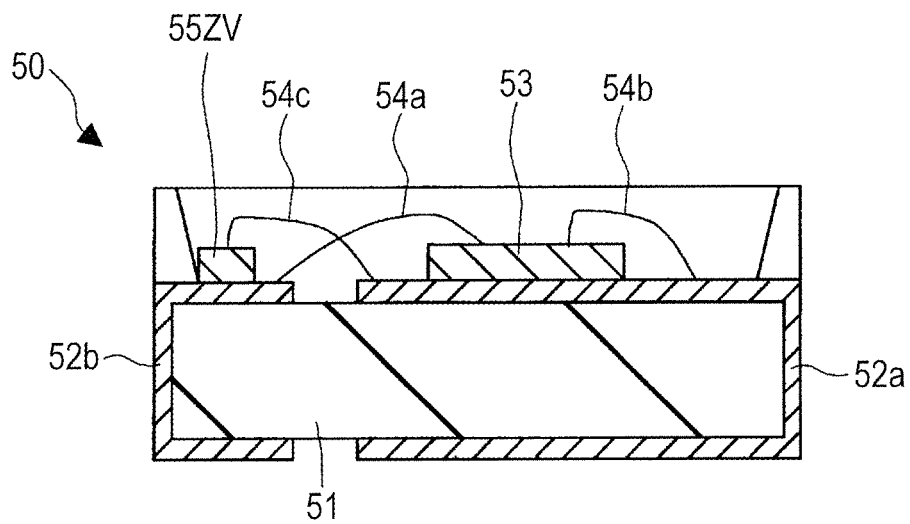
FIG. 26 is a sectional view of the LED package taken along the line X10-X10 of FIG. 25.

FIG. 25 is a plan view of an LED package 50 which the present inventors have conceived and FIG. 26 is a sectional view of the LED package 50 taken along the line X10-X10 of FIG. 25. For easy understanding, FIG. 25 shows the inside of the LED package 50 as seen through its outside.

A wiring 52a and a wiring 52b are formed on a wiring board 51 of the LED package 50 and electrically isolated from each other. An LED chip 53 is mounted over the wiring 52a with its main surface up. An anode electrode and a cathode electrode (not shown) are formed over the main surface of the LED chip 53. The anode electrode of the LED chip 53 is electrically coupled to the wiring 52b through a metal wire 54b and the cathode electrode is electrically coupled to the wiring 52a through a metal wire 54b.

On the other hand, a protective chip 55ZV is mounted over the wiring 52b with its main surface up. A vertical Zener diode which protects the LED chip 53 from ESD is formed in the protective chip 55ZV. An anode electrode (not shown) is formed on the main surface of the protective chip 55ZV and a cathode electrode (not shown) is formed on the back surface of the protective chip 55ZV. The anode electrode of the protective chip 55ZV is electrically coupled to the wiring 52a through a metal wire 54c and its cathode electrode is electrically coupled to the wiring 52b through a conductive bonding layer made of silver (Ag) paste (not shown in FIGS. 25 and 26).

Figure 27:
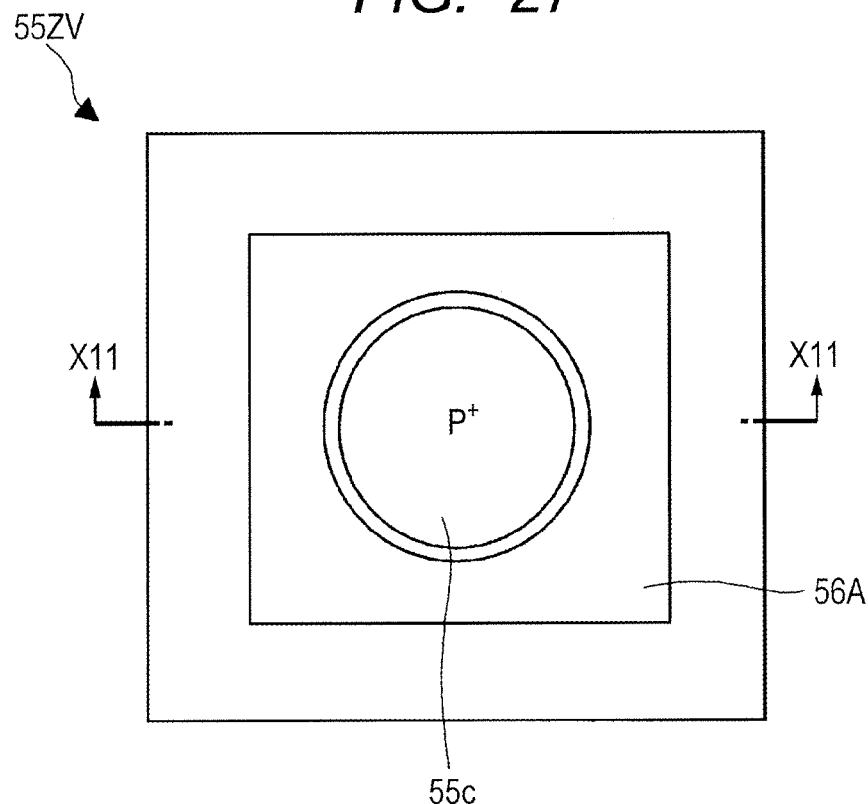
FIG. 27 is a plan view of the protective chip in the LED package shown in FIG. 25.
Figure 28:
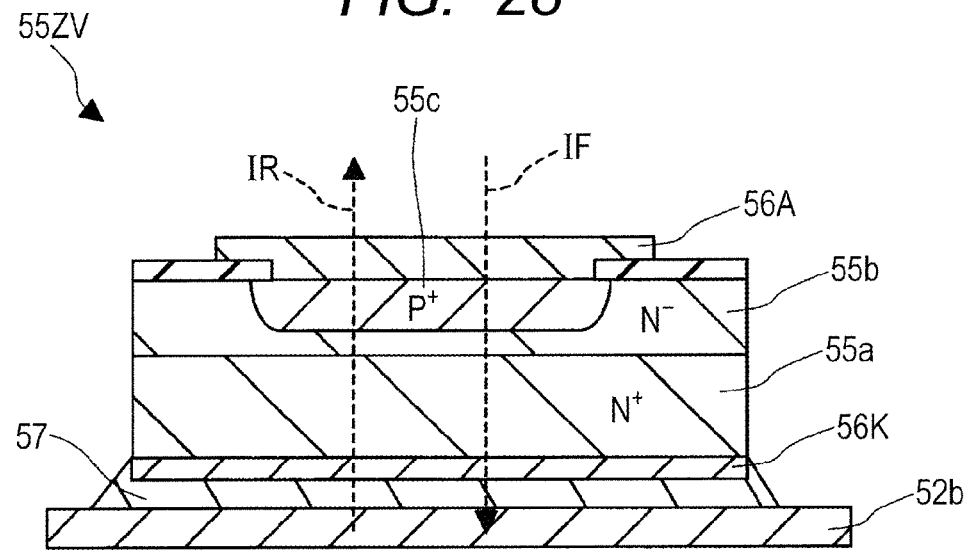
FIG. 28 is a sectional view of the protective chip taken along the line X11-X11 of FIG. 27.

FIG. 27 is a plan view of the protective chip 55ZV shown in FIGS. 25 and 26 and FIG. 28 is a sectional view of the protective chip 55ZV taken along the line X11-X11 of FIG. 27.

For example, the protective chip 55ZV is in the form of a planar square semiconductor substrate which includes an $n^+$ type semiconductor layer 55a, an $n^-$ type semiconductor layer 55b lying over it, and a $p^+$ type semiconductor region 55c contained in the $n^-$ type semiconductor layer 55b.

The $p^+$ type semiconductor region 55c in the main surface of the protective chip 55ZV is electrically coupled to an anode electrode 56A. On the other hand, a cathode electrode 56K is formed on the back surface of the protective chip 55ZV. The cathode electrode 56K is electrically coupled to the wiring 52b through a conductive bonding layer 57 made of, for example, Ag paste. In FIG. 28, broken line arrow IF indicates a forward current and broken line arrow IR indicates a reverse current.

This kind of vertical Zener diode (protective chip 55ZV) has the following problem. First, an Ag paste coating step for the formation of the bonding layer 57 is required, thus making the semiconductor device assembly process more complicated. Second, partly because of the use of Ag paste, the main surface height of the protective chip 55ZV (height from the upper surface of the wiring 52b to the main surface of the protective chip 55ZV) increases and as a consequence, a shadow is produced when the LED chip 53 lights up, resulting in a decline in the luminance efficiency of the LED package 50. If the protective chip 55ZV is located in a remoter position from the LED chip 53 in order to increase the luminance efficiency of the LED package 50, it would be difficult to achieve the desired compactness of the LED package 50. If the back surface of the protective chip 55ZV should peel off, the required electrical characteristics of the protective chip 55ZV would not be obtained.

For the above reason, recently, surface Zener diodes which have both an anode electrode and a cathode electrode on the main surface of a protective chip have been more popularly used than vertical Zener diodes. FIGS. 29 to 32 are sectional views of a protective chip 55ZL with a surface Zener diode.

Figure 29:
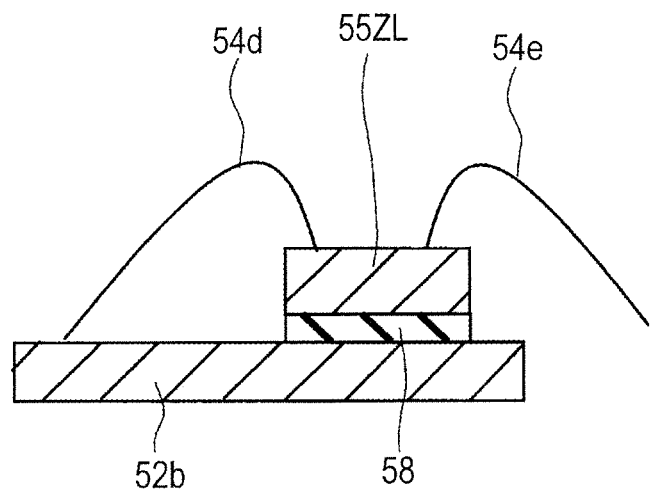
FIG. 29 is a sectional view of a surface protective chip.

As shown in FIG. 29, a protective chip 55ZL with a surface Zener diode is mounted over a wiring 52b with its main surface up and its back surface facing the wiring 52b through an insulating bonding layer 58 of, for example, silicone resin. An anode electrode and a cathode electrode are formed on the main surface of the protective chip 55ZL and coupled to other parts through metal wires 54d and 54e.

Figure 30:
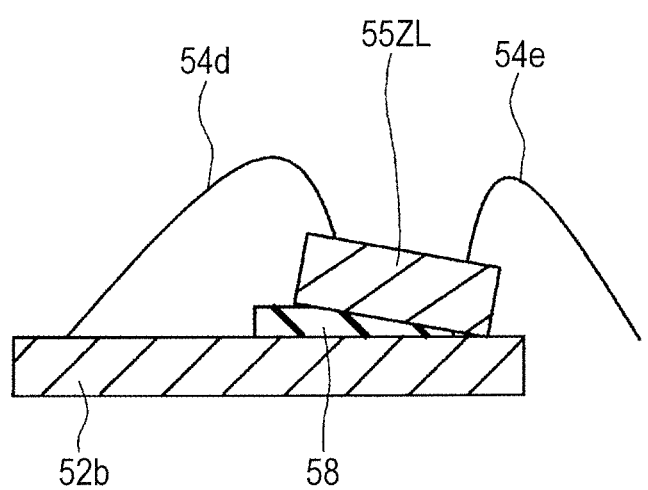
FIG. 30 is a sectional view showing that the surface protective chip is mounted in an inclined manner over a wiring.

However, this surface protective chip 55ZL has a problem that if it is mounted in an inclined manner as shown in FIG. 30, a corner of the back surface of the protective chip 55ZL may contact the wiring 52b and make an electrical connection and the required electrical characteristics of the Zener diode may not be obtained. Also, the thinner the protective chip 55ZL is, the more likely it is to incline when being mounted, thus making it difficult to achieve the desired thinness of the protective chip 55ZL.

Figure 31:
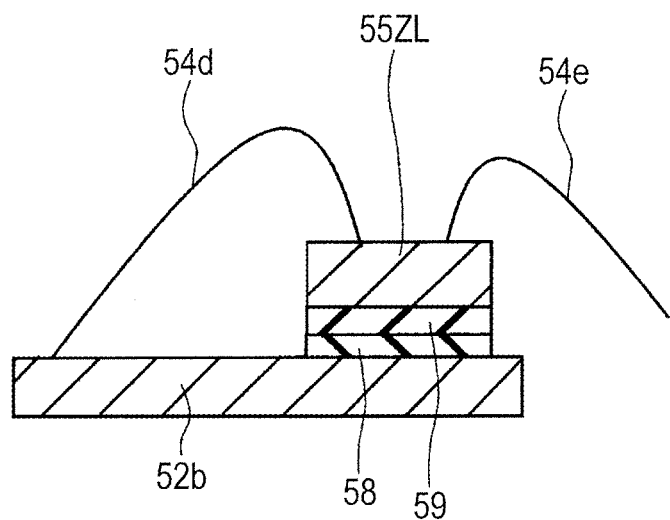
FIG. 31 is a sectional view of a countermeasure to prevent the back surface of the surface protective chip from being in contact with the wiring.

As a solution to the above problem, an insulating film 59 for prevention of contact is formed on the back surface of the protective chip 55ZL as shown in FIG. 31. In this case, even if the protective chip 55ZL is mounted in an inclined manner over the wiring 52b, the insulating film 59 on the back surface of the protective chip 55ZL prevents a contact failure between the protective chip 55ZL and the wiring 52b and enables the Zener diode to provide the required electrical characteristics.

However, in that case, since the wafer for the formation of the protective chip 55ZL is thin, it would be difficult to form the insulating film 59 on its back surface. If the insulating film 59 on the back surface of the protective chip 55ZL is made of resin, adhesion between the insulating film 59 for prevention of contact and the bonding layer 58 would be weak and the protective chip 55ZZ would tend to peel easily. For these reasons, the process of manufacturing the LED package 50 would be more complicated.

Figure 32:
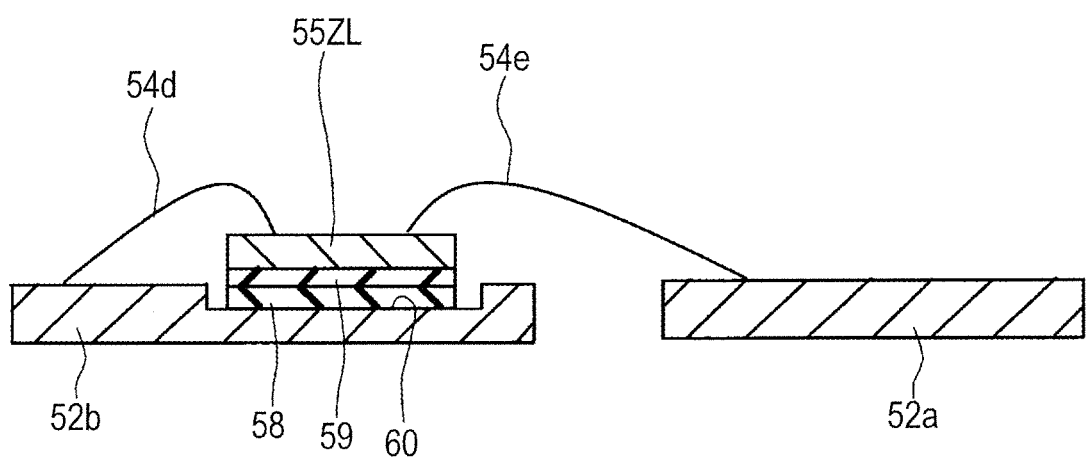
FIG. 32 is a sectional view of the wiring structure to decrease the main surface height of the protective chip shown in FIG. 31.

Furthermore, due to the presence of the insulating film 59 on the back surface of the protective chip 55ZL, it would be difficult to achieve the desired thinness of the protective chip 55ZL. For the above reason, when the LED chip 53 lights up, a shadow of the protective chip 55ZL would be produced, resulting in a decline in the luminance efficiency. A possible solution to this problem may be to make a concave 60 in the upper surface of the wiring 52b as shown in FIG. 32 and mount the protective chip 55ZL in the concave to decrease the main surface height of the chip 55ZL. However, in that case, the process of manufacturing the LED package 50 would be more complicated and the cost would be higher.

Next, the structure of a semiconductor device according to the first embodiment will be described.

Figure 1:
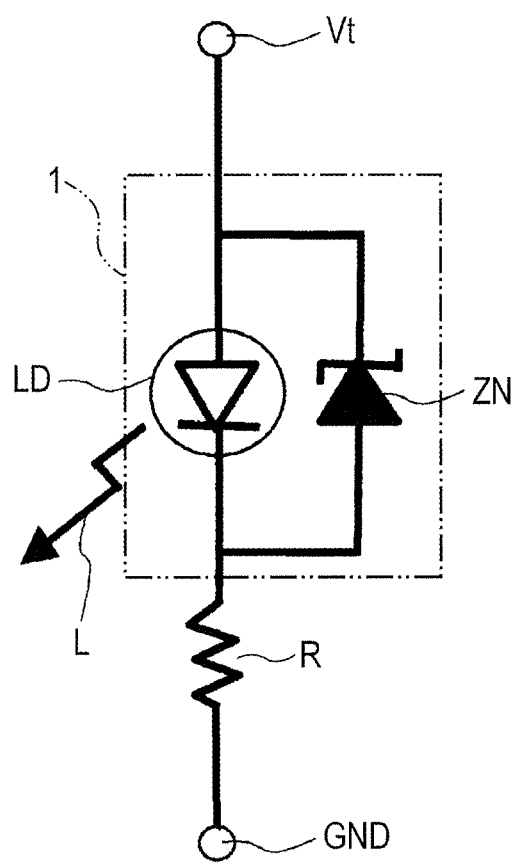
FIG. 1 is a circuit diagram of a semiconductor device according to a first embodiment of the present invention and its vicinity.

FIG. 1 is a circuit diagram of a semiconductor device 1 according to the first embodiment and its vicinity. The semiconductor device 1 according to the first embodiment includes alight emitting element (electronic component) LD and a protective element ZN which protects the light emitting element LD from ESD.

The light emitting element LD is, for example, an LED which emits light when direct forward current is supplied. The principle of light emission of an LED is as follows. When forward bias voltage is applied to the PN junction of the LED, holes are injected from the p-type semiconductor region of the LED into the PN junction and electrons are injected from the n-type semiconductor region of the LED into the PN junction. As a consequence, holes and electrons are recombined in the PN junction. In this recombination, electrons in the conduction band emit band gap energy and are combined with holes in the valence band. Therefore, at the time of recombination, emission of band gap energy occurs and this energy emission is emission of light L with band gap energy.

The protective element ZN is, for example, a Zener diode (protective diode) which is coupled electrically in parallel to the light emitting diode LD in a reverse direction with respect to the light emitting element LD. Specifically, the anode electrode of the protective element ZN is electrically coupled to the cathode electrode of the light emitting element LD and the cathode electrode of the protective element ZN is electrically coupled to the anode electrode of the light emitting element LD.

The principle of protection by the Zener diode is as follows. When a surge voltage due to static electricity or the like is applied from outside to the light emitting element LD, the surge voltage is also applied to the protective element ZN coupled in parallel to the light emitting element LD. If the applied surge voltage exceeds a breakdown voltage level, breakdown occurs and reverse current flows in the protective element ZN. At this time, the voltage applied to the broken-down Zener diode is a Zener voltage lower than the serge voltage. In other words, as the Zener diode breaks down, the serge voltage is absorbed by the Zener diode and replaced by the Zener voltage. Therefore, the Zener voltage which is lower than the surge voltage is applied to the light emitting element LD. As a consequence, the light emitting element LD is protected from ESD.

The light emitting element LD and protective element ZN are electrically coupled between a power supply terminal Vt and a grounding terminal GND. A first potential is supplied to the power supply terminal Vt and a second potential (reference potential) lower than the first potential is supplied to the grounding terminal GND. On the outside of the semiconductor device 1, a resistor R is electrically coupled between the cathode electrode of the light emitting element LD and the anode electrode of the protective element ZN, and the grounding terminal GND.

The semiconductor device 1 may be used for lighting devices such as liquid crystal display backlights, light sources for vehicles or traffic lights.

Figure 2:
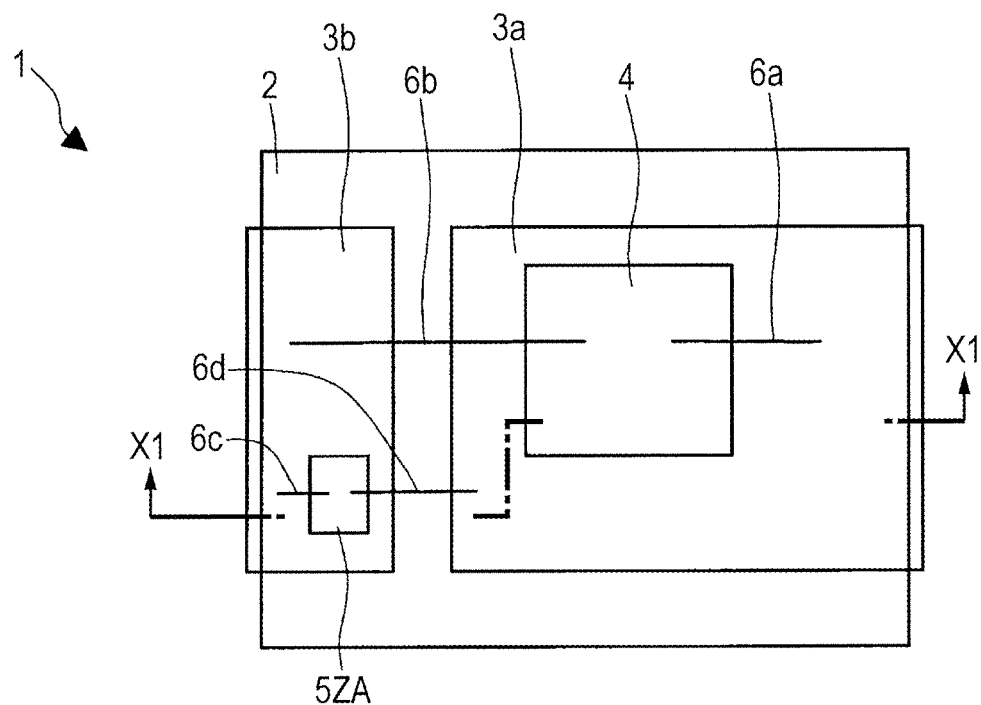
FIG. 2 is a general plan view of the package structure of the semiconductor device shown in FIG. 1.
Figure 3:
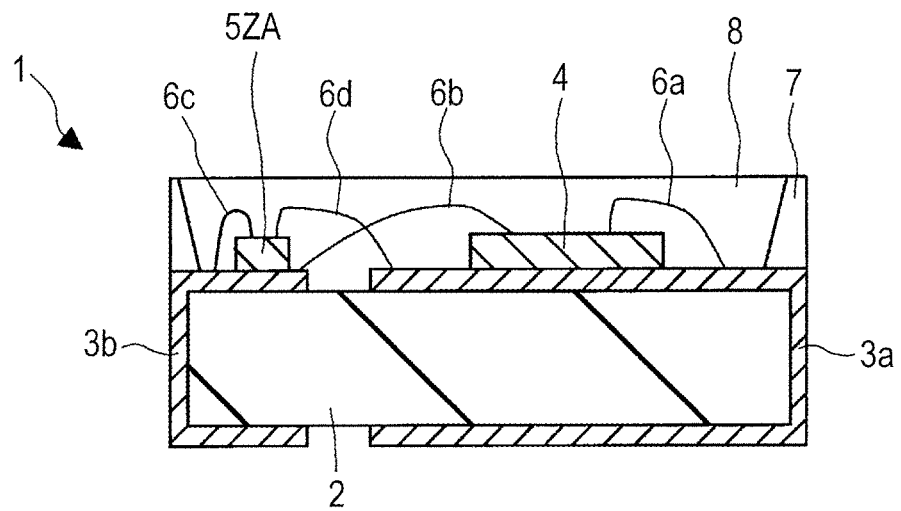
FIG. 3 is a sectional view of the semiconductor device taken along the line X1-X1 of FIG. 2.
Figure 4:
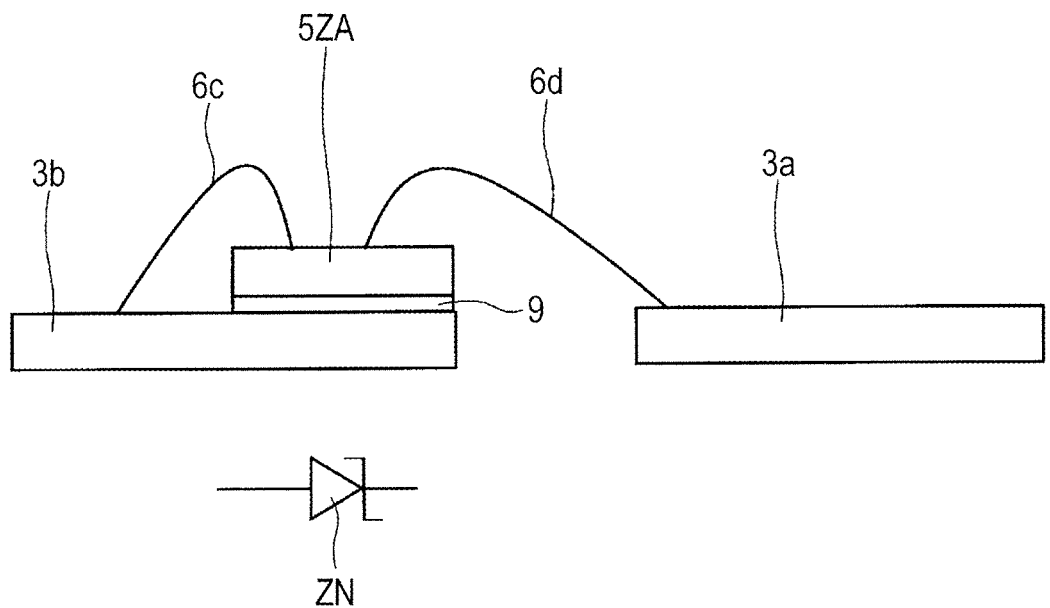
FIG. 4 is an enlarged side view of an essential part of the protective chip of the semiconductor device shown in FIG. 3 and its vicinity.

FIG. 2 is a general plan view of the package structure of the semiconductor device 1 shown in FIG. 1, FIG. 3 is a sectional view of the semiconductor device 1, taken along the line X1-X1 of FIG. 2, and FIG. 4 is an enlarged side view of an essential part of the protective chip of the semiconductor device 1 shown in FIG. 3 and its vicinity. For easy understanding, FIG. 2 shows the package inside of the semiconductor device 1 as seen through its outside. FIG. 4 also shows the protective element ZN to illustrate how the protective element ZN is coupled.

The semiconductor device 1 includes a package substrate 2, wirings 3a and 3b, a light emitting chip 4, a protective chip (semiconductor chip) 5ZA, metal wires (coupling line members) 6a to 6d, a reflector 7, and sealing resin 8.

For example, the package substrate 2 is a flat plate-like insulating body surrounded by a main surface, a back surface on its reverse side, and four side faces intersecting with them. The insulating body of the package substrate 2 is a printed board made of glass epoxy resin or a ceramic substrate made of aluminum oxide, aluminum nitride or the like. If the printed board is used as the package substrate 2, it is desirable that the printed circuit board be provided with a heat radiating region.

The wirings 3a and 3b have a main conductor part of, for example, copper (Cu) alloy whose surface is coated with Ag. The wirings 3a and 3b are formed on the package substrate 2 and electrically isolated from each other.

One wiring (first wiring) 3a extends along the main surface of the package substrate 2 and bends down along the side face of the package substrate 2 at one longitudinal end of the package substrate 2 and extends along the back surface of the package substrate 2. The wiring 3a is electrically coupled to the power supply terminal Vt (see FIG. 1).

The other wiring (second wiring) 3b extends along the main surface of the package substrate 2 and bends down along the side face of the package substrate 2 at the other longitudinal end of the package substrate 2 and extends along the back surface of the package substrate 2. The wiring 3b is electrically coupled to the grounding terminal GND (see FIG. 1).

On the main surface side of the package substrate 2, the light emitting chip 4 is mounted over the wiring 3a with its light emitting surface up and its back surface facing the wiring 3a.

In the light emitting chip 4, the light emitting element LD is formed, for example, by sequentially stacking a gallium nitride (GaN) layer, n-type GaN layer, indium gallium nitride (InGaN) active layer, p-type aluminum gallium nitride (AlGaN) layer, and p-type GaN layer over an insulating substrate such as a sapphire substrate. The InGaN active layer emits light.

The anode electrode and cathode electrode (not shown) of the light emitting element LD are formed on the light emitting face of the light emitting chip 4. The anode electrode of the light emitting element LD is electrically coupled to the wiring 3a through a metal wire 6a and the cathode electrode is electrically coupled to the wiring 3b through a metal wire 6b. The metal wires 6a and 6b are made of, for example, gold (Au). The back surface of the light emitting chip 4 is bonded to the wiring 3a through a bonding layer, for example, of silicone resin (not shown).

The protective chip 5ZA is mounted over the wiring 3b with its main surface (first surface) up and its back surface (second surface) facing the wiring 3b. The protective element ZN as mentioned above is formed in the protective chip 5ZA.

The protective element ZN of the protective chip 5ZA is a surface Zener diode in which an anode electrode and a cathode electrode (not shown) as a pair of electrodes of the protective element ZN are formed on the main surface of the protective chip 5ZA. The anode electrode of the protective element ZN is electrically coupled to the wiring 3b through a metal wire 6c and the cathode electrode is electrically coupled to the wiring 3a through a metal wire 6d. The metal wires 6c and 6d are made of, for example, gold (Au). The protective chip 5ZA is bonded to the wiring 3b through an insulating bonding layer 9, for example, of silicone resin (see FIG. 4).

In the case of the vertical Zener diode as mentioned above, the cathode electrode 56K on the back surface of the protective chip 5ZV must be electrically coupled to the wiring 52b by Ag paste as shown in FIG. 28. By contrast, in the case of the protective chip 5ZA having the surface Zener diode in this embodiment, a circuit is not formed by coupling the back surface of the protective chip 5ZA to the wiring 3b, so it is unnecessary to couple the back surface of the protective chip 5ZA to the wiring 3b electrically. Therefore, there is no need to coat the back surface of the protective chip 5ZA with Ag paste, thus simplifying the manufacturing process for the semiconductor device 1.

In addition, since a circuit is not formed by coupling the protective chip 5ZA to the wiring 3b, even if the protective chip 5ZA should peel off the wiring 3b, the electrical characteristics of the protective chip 5ZA will not change seriously. Therefore, the reliability of the semiconductor device 1 is improved.

The reflector 7 is located on the periphery of the main surface of the package substrate 2 in a way to surround the light emitting chip 4 and protective chip 5ZA. The reflector 7, made of aluminum, ceramic or the like, has a reflecting surface which reflects the light emitted from the light emitting chip 4 outwards. Sealing resin 8 containing a fluorescence substance is embedded in the area of the main surface of the package substrate 2 which is surrounded by the reflector 7, so that the light emitting chip 4 and protective chip 5ZA are sealed.

Figure 5:
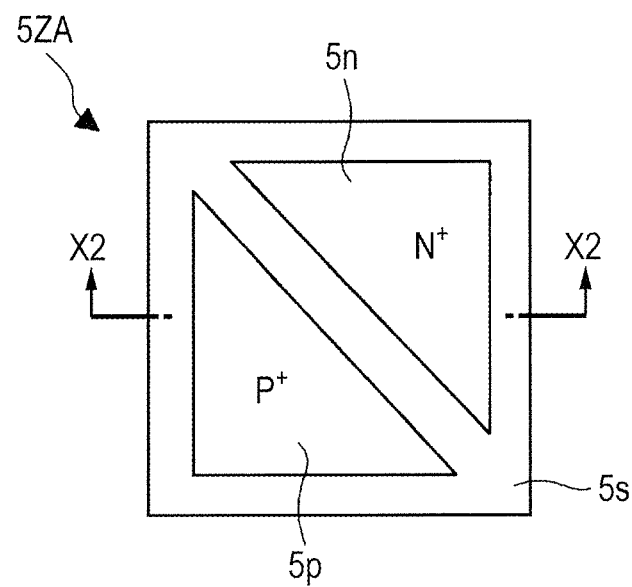
FIG. 5 is an enlarged plan view of the protective chip shown in FIG. 2.
Figure 6:
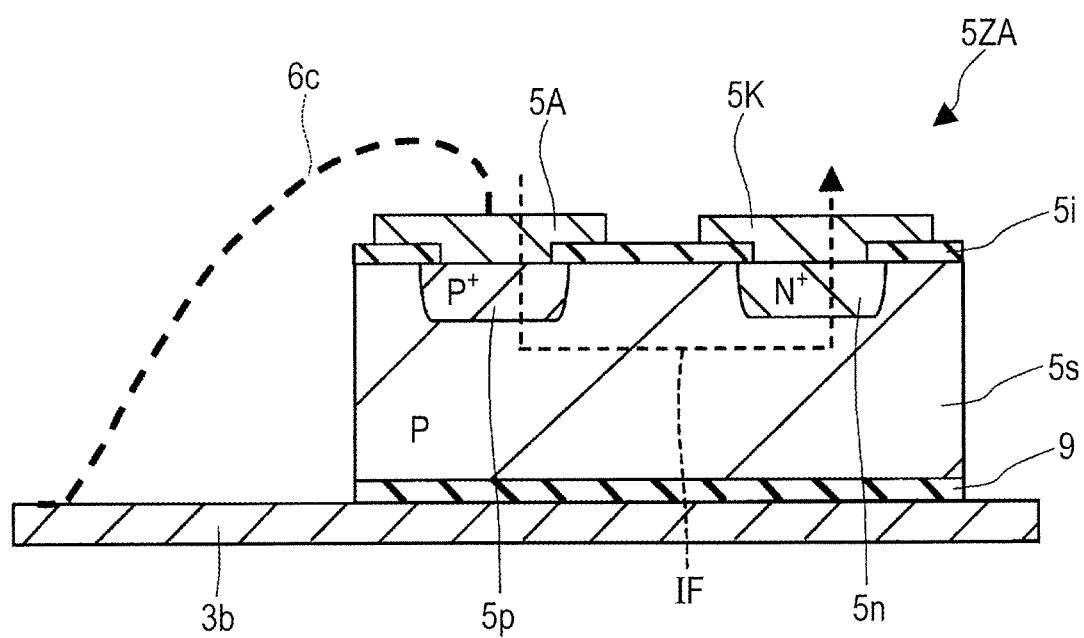
FIG. 6 is a sectional view of the protective chip taken along the line X2-X2 of FIG. 5.

FIG. 5 is an enlarged plan view of the protective chip 5ZA and FIG. 6 is a sectional view of the protective chip 5ZA, taken along the line X2-X2 of FIG. 5.

For example, the protective chip 5ZA includes a flat plate-like semiconductor substrate 5s surrounded by a main surface, a back surface on its reverse side and four side faces intersecting with them. The semiconductor substrate 5s is, for example, made of p-type silicon (Si). In its main surface, a p$^+$ type semiconductor region 5p and n$^+$ type semiconductor region 5n are arranged side by side and spaced from each other. As shown in FIG. 5, the p$^+$ type semiconductor region 5p and n$^+$ type semiconductor region 5n are in the shape of, for example, a plane triangle and their long sides face each other.

An insulating film 5i of silicon oxide is formed over the main surface of the semiconductor substrate 5s as shown in FIG. 6. An anode electrode 5A and a cathode electrode 5K as a pair of electrodes are formed over the insulating film 5i and electrically isolated from each other. The anode electrode 5A and cathode electrode 5K are made of, for example, an Al-based metal.

The anode electrode 5A is electrically coupled to the p$^+$ type semiconductor region 5p in an ohmic contact manner through a hole made in the insulating film 5i. The cathode electrode 5K is electrically coupled to the n$^+$ type semiconductor region 5n in an ohmic contact manner through a hole made in the insulating film 5i.

In the case of the protective chip 5ZA which has a surface Zener diode as mentioned above, forward current IF flows from the p$^+$ type semiconductor region 5p to the n$^+$ type semiconductor region 5n along the main surface of the semiconductor substrate 5s as indicated by the dotted line in FIG. 6.

The semiconductor region 5p electrically coupled to the anode electrode 5A has the same conductivity type (p type) as the semiconductor substrate 5s and is electrically coupled to the back surface of the semiconductor substrate 5s without PN junction. Specifically the anode electrode 5A is electrically coupled to the wiring 3b through the metal wire 6c and also electrically coupled to the back surface of the protective chip 5ZA inside the protective chip 5ZA.

Therefore, even if the protective chip 5ZA is mounted over the wiring 3b in an inclined manner and a back surface corner of the semiconductor substrate 5s is in contact with the wiring 3b, no problem occurs with the electrical characteristics of the protective element ZN because the back surface of the semiconductor substrate 5s is electrically coupled to the wiring 3b through the metal wire 6c from the anode electrode 5A.

In this embodiment, the insulating film 59 for prevention of contact (see FIG. 31) is not formed on the back surface of the protective chip 5ZA (semiconductor substrate 5s) and the protective chip 5ZA (semiconductor substrate 5s) is mounted over the wiring 3b with its back surface (Si surface) in direct contact with the bonding layer 9.

According to this embodiment, it is unnecessary to form the insulating film 59 for prevention of contact on the back surface of the protective chip 5ZA, so that it is easier to manufacture the protective chip 5ZA. Also it is unnecessary to make a concave in the wiring 3b in order to decrease the main surface height of the protective chip 5ZA, so that it is easier to manufacture the semiconductor device 1.

In addition, since the resin bonding layer 9 well adheres to Si and the back surface of the protective chip 5ZA is in direct contact with the bonding layer 9, the possibility that the protective chip 5ZA might peel (mounting failure) is reduced. Therefore, the reliability of the semiconductor device 1 is improved.

Furthermore, since the bonding layer 9 on the back surface of the protective chip 5ZA can be thinner than the Ag paste, the main surface height of the protective chip 5ZA (height from the upper surface of the wiring 3b to the main surface of the protective chip 5ZA) can be smaller than the main surface height of the vertical protective chip 55ZV (see FIG. 25 and so on). Due to the absence of the insulating film 59 for prevention of contact on the back surface of the protective chip 5ZA, the main surface height of the protective chip 5ZA can be smaller than that of the protective chip with a surface Zener diode which has the insulating film 59 for prevention of contact on its back surface. Furthermore, since a contact failure of the back surface attributable to the inclination of the protective chip 5ZA is tolerable, the thickness of a wafer used to make a protective chip can be decreased. For this reason, the main surface height of the protective chip 5ZA can be further decreased. Consequently, the shadow of the protective chip 5ZA in the semiconductor device 1 can be smaller, so the luminance efficiency of the light emitting chip 4 can be enhanced. Also the thickness of the semiconductor device 1 can be decreased. Since there is no need to keep the protective chip 5ZA distant from the light emitting chip 4, there is no obstacle to reducing the size of the semiconductor device 1.

Figure 15:
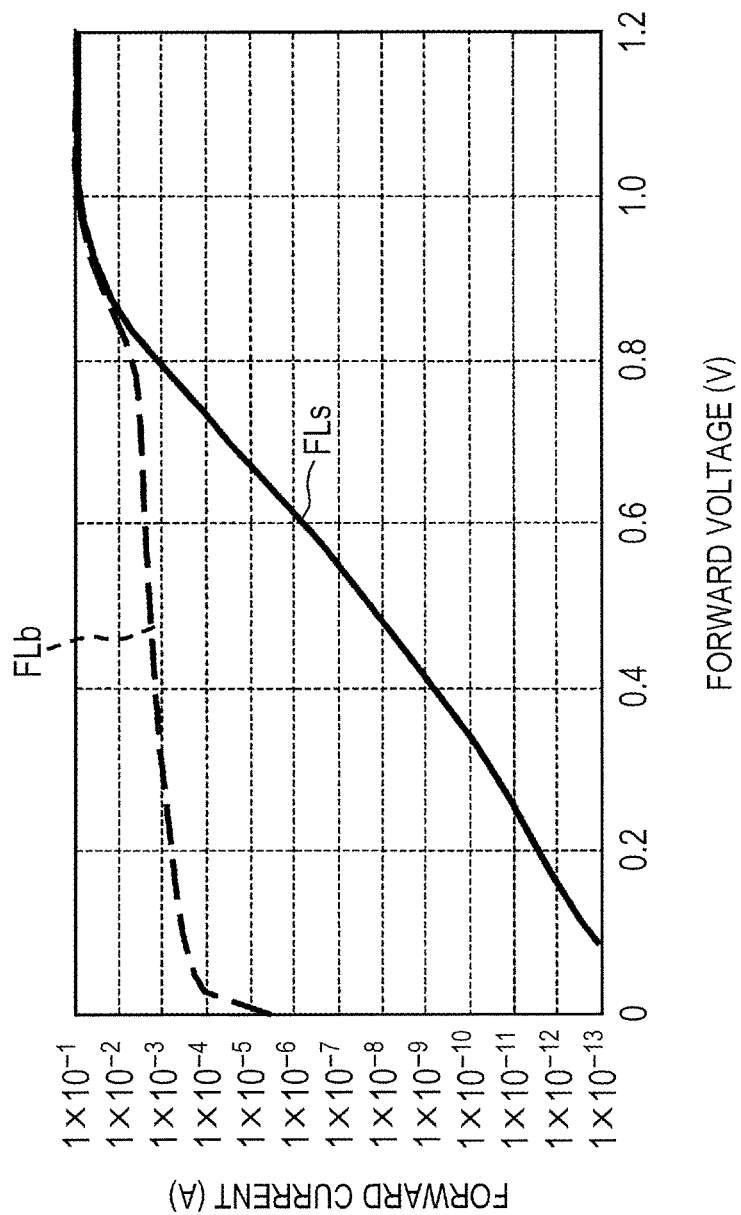
FIG. 15 is a graph showing the result of measurement of forward electrical characteristics of the protective chips shown in FIGS. 7 to 14.
Figure 16:
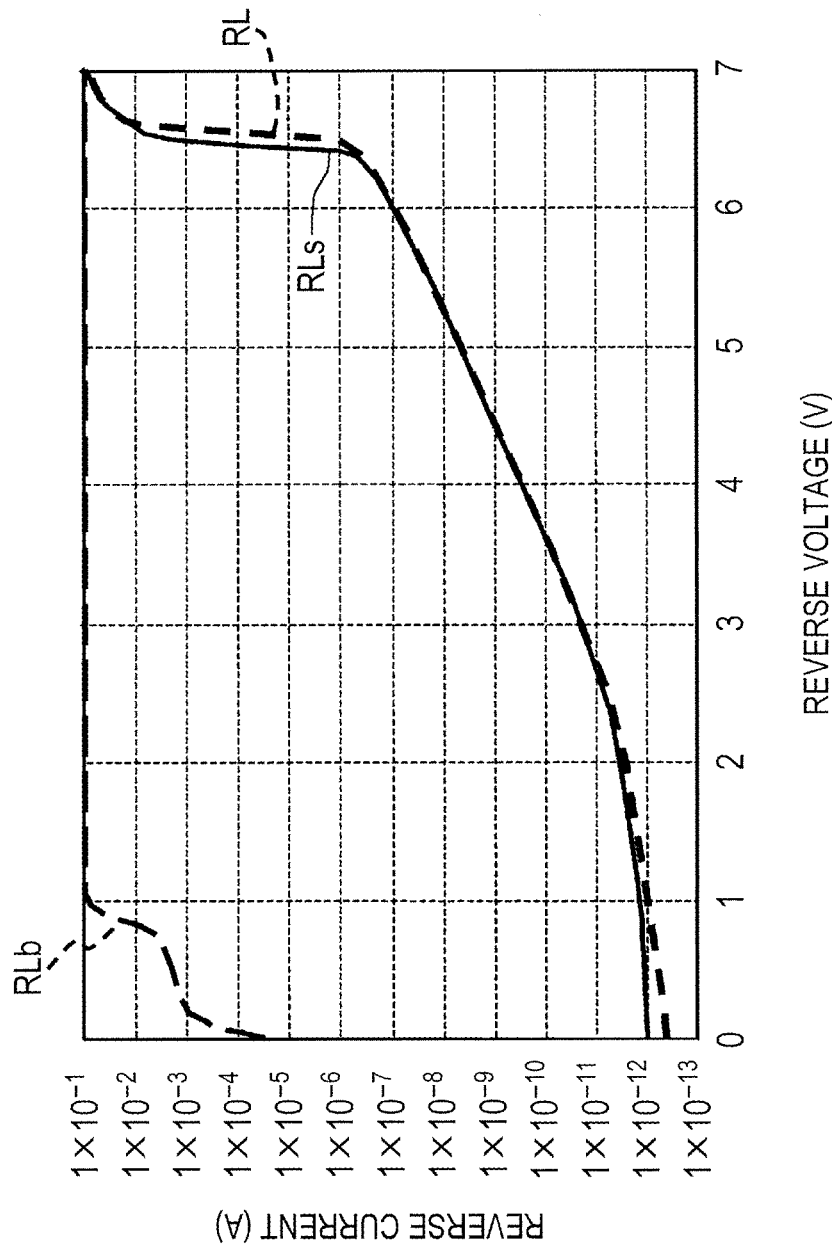
FIG. 16 is a graph showing the result of measurement of reverse electrical characteristics of the protective chips shown in FIGS. 7 to 14.

Next, the electrical characteristics of the protective chip 5ZA of the semiconductor device 1 according to the first embodiment will be explained referring to FIGS. 7 to 16. FIGS. 7 to 14 show the various protective chip structures which the present inventors have conceived. FIGS. 15 and 16 are graphs which show the measurement result of forward and reverse electrical characteristics of the various protective chips shown in FIGS. 7 to 14 in a simplified manner.

FIG. 7 is a side view of a surface protective chip 55ZL which includes an insulating film 59 for prevention of contact on its back surface and FIG. 8 is an enlarged sectional view of the protective chip 55ZL shown in FIG. 7. The protective element ZN is also shown in FIG. 7 as in FIG. 4.

The insulating film 59 for prevention of contact is formed on the back surface of the protective chip 55ZL as shown in FIG. 7. This means that the protective chip 55ZL is mounted over the wiring 52b through the insulating film 59 and bonding layer 58.

As shown in FIG. 8, the semiconductor substrate 55s of the protective chip 55ZL, made of n-tye Si, has a $p^+$ type semiconductor region 55p electrically coupled to an anode electrode and an $n^+$ type semiconductor region 55n electrically coupled to a cathode electrode on its main surface.

In this structure, since the insulating film 59 is formed on the back surface of the protective chip 55ZL, even if the protective chip 55ZL is mounted in an inclined manner, no electrical coupling with the wiring 52b is made. Therefore, good forward electrical characteristics are provided as indicated by solid line FLs in FIG. 15 and also good reverse electrical characteristics are provided as indicated by solid line RLs in FIG. 16. FIGS. 15 and 16 suggest that this structure provides good electrical characteristics.

Figure 9:
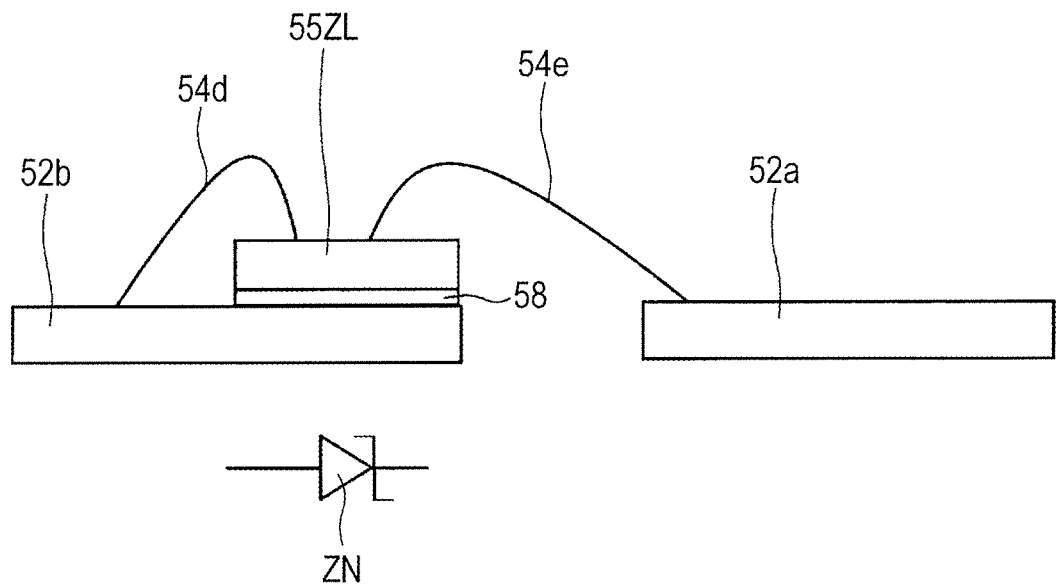
FIG. 9 is a side view of a surface protective chip with the same basic structure as shown in FIGS. 7 and 8, which does not include an insulating film for prevention of contact on its back surface.
Figure 10:
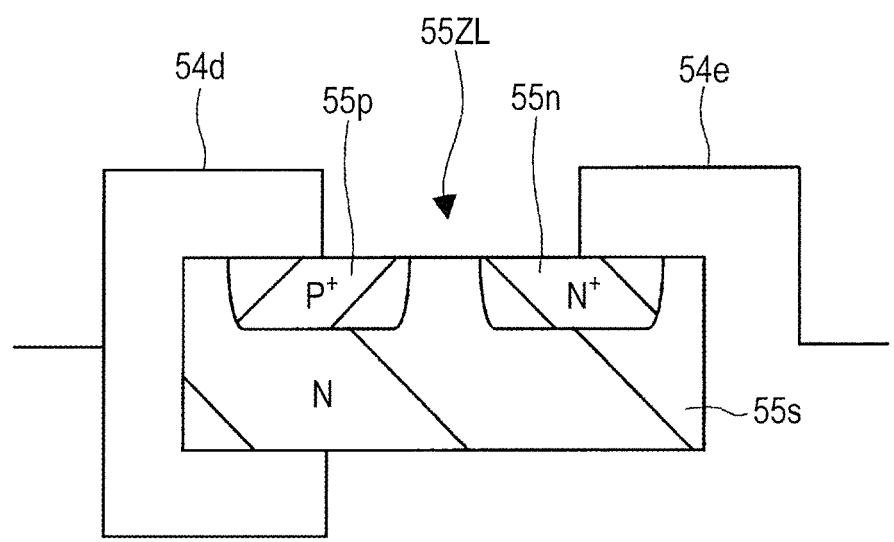
FIG. 10 is an enlarged sectional view of the protective chip shown in FIG. 9.

FIG. 9 is a side view of a surface protective chip 55ZL with the same basic structure as shown in FIG. 8, which does not include an insulating film 59 for prevention of contact on its back surface and FIG. 10 is an enlarged sectional view of the protective chip 55ZL shown in FIG. 9. The protective element ZN is also shown in FIG. 9 as in FIG. 4.

In this structure, since the insulating film 59 is not formed on the back surface of the protective chip 55ZL as shown in FIG. 9, if the protective chip 55ZL is mounted in an inclined manner, a back surface corner of the protective chip 55ZL might be electrically coupled to the wiring 52b, thereby causing electrical coupling between the anode electrode of the protective chip 55ZL and the back surface of the protective chip 55ZL.

In this structure, as shown in FIG. 10, since the conductivity type of the semiconductor region 55p electrically coupled to the anode electrode is different from that of the semiconductor substrate 55s, if the anode electrode and the back surface of the protective chip 55ZL are electrically coupled to each other, short-circuiting occurs between the anode electrode and cathode electrode of the protective element ZN. Consequently the desired electrical characteristics of the protective element ZN are not obtained. Therefore, this structure provides forward electrical characteristics as indicated by dotted line FLb in FIG. 15 and reverse electrical characteristics as indicated by dotted line RLb in FIG. 16 which are both far from good electrical characteristics (solid lines FLs and RLs).

Figure 11:
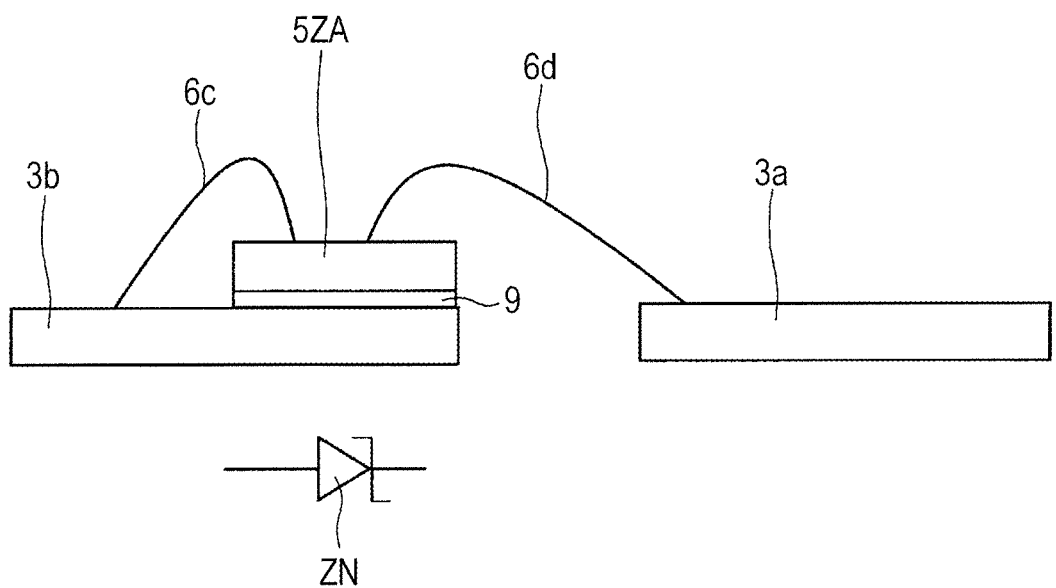
FIG. 11 is a side view of the protective chip of the semiconductor device shown in FIG. 4 according to the first embodiment.
Figure 12:
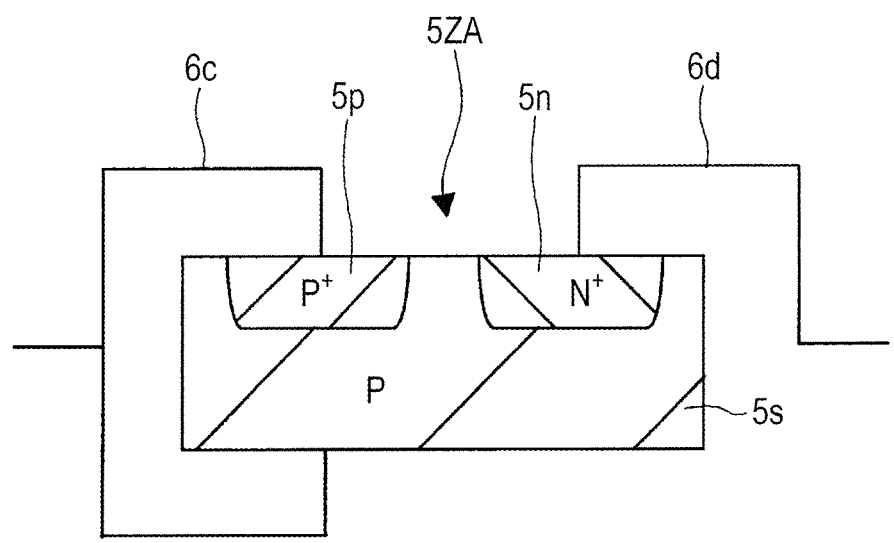
FIG. 12 is an enlarged sectional view of the protective chip shown in FIG. 11.

FIG. 11 is a side view of the protective chip 5ZA shown in FIG. 4 according to this embodiment and FIG. 12 is an enlarged sectional view of the protective chip 5ZA shown in FIG. 11. The protective element ZN is also shown in FIG. 11 as in FIG. 4.

In this structure, as shown in FIG. 11 the insulating film 59 for prevention of contact is not formed on the back surface of the protective chip 5ZA, but as shown in FIG. 12 the conductivity type of the semiconductor region 5p electrically coupled to the anode electrode is the same as that of the semiconductor substrate 5s, so the anode electrode is electrically coupled to the back surface of the protective chip 5ZA without PN junction through the $p^+$ type semiconductor region 5p inside the protective chip 5ZA.

Consequently, even if the protective chip 5ZA is mounted in an inclined manner and a back surface corner of the protective chip 5ZA is electrically coupled to the wiring 3b, no problem occurs with the electrical characteristics of the protective element ZN. Therefore, the forward electrical characteristic curve of this structure coincides with the good forward electrical characteristic curve (solid line FLs) as shown in FIG. 15 and the reverse electrical characteristic curve (dotted line RL) of this structure almost coincides with the good reverse electrical characteristic curve (dotted line RLs) as shown in FIG. 16.

Figure 13:
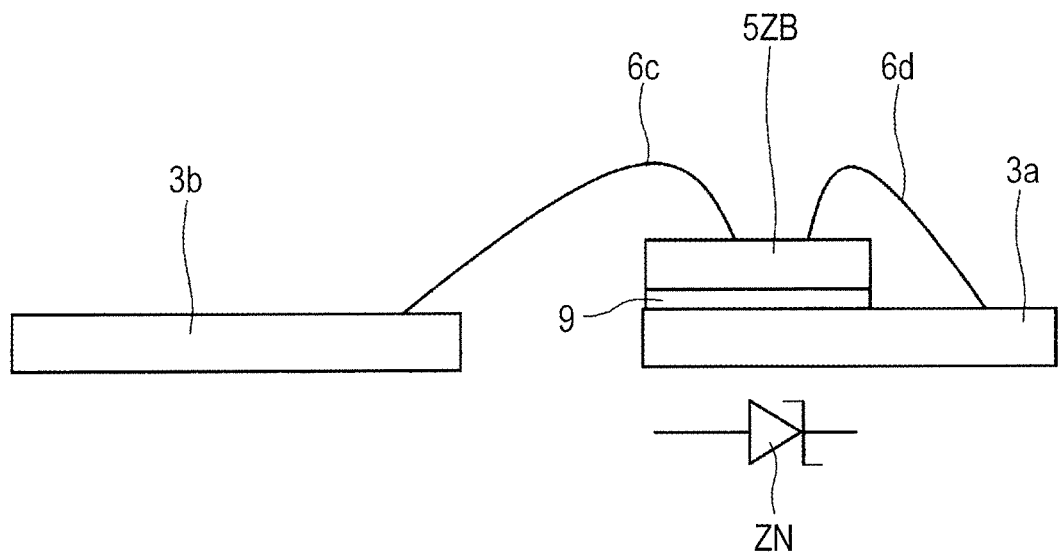
FIG. 13 is a side view of a surface protective chip as another example of the first embodiment.
Figure 14:
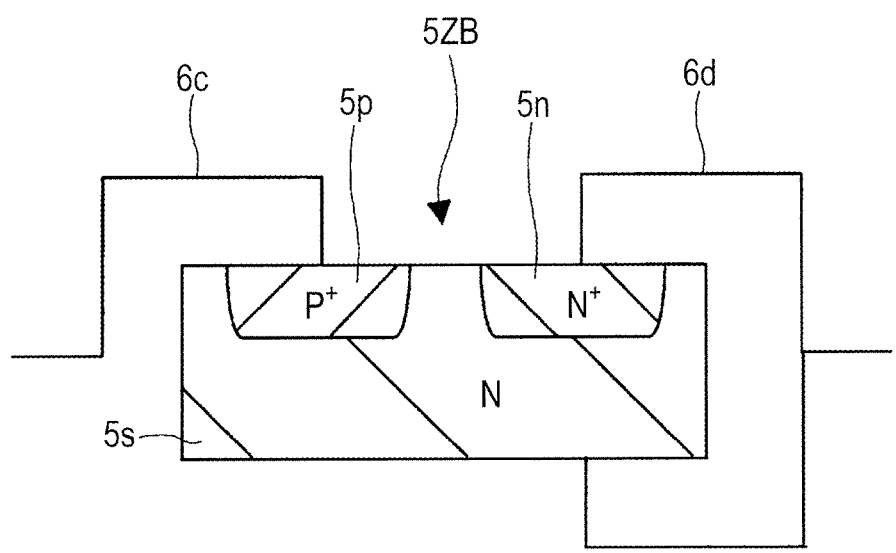
FIG. 14 is an enlarged sectional view of the protective chip shown in FIG. 13.

FIG. 13 is a side view of a surface protective chip 5ZB with a Zener diode ZN as another example of this embodiment and FIG. 14 is an enlarged sectional view of the protective chip 5ZB shown in FIG. 13. The protective element ZN is also shown in FIG. 14 as in FIG. 4.

This structure does not have an insulating film 59 for prevention of contact formed on the back surface (second surface) of the protective chip (semiconductor chip) 5ZB as shown in FIG. 13. Therefore, the protective chip 5ZB is mounted with its back surface in direct contact with the bonding layer 9.

Also, as shown in FIG. 14, the semiconductor substrate 5s of the protective chip 5ZB, made of n-tye Si, has a $p^+$ type semiconductor region 5p electrically coupled to an anode electrode and an $n^+$ type semiconductor region 5n electrically coupled to a cathode electrode on its main surface (first surface). The other constituent elements of the protective chip 5ZB are the same as illustrated in FIG. 6 and so on.

In this case, since the conductivity type of the semiconductor region 5n electrically coupled to the cathode electrode is the same as that of the semiconductor substrate 5s, the protective chip 5ZB is mounted over the wiring 3a coupled to the cathode electrode through a metal wire 6d as shown in FIG. 13.

In this structure, the insulating film 59 is not formed on the back surface of the protective chip 5ZB, but the conductivity type of the semiconductor region 5n electrically coupled to the cathode electrode is the same as that of the semiconductor substrate 5s, so the cathode electrode is electrically coupled to the back surface of the protective chip 5ZB without PN junction through the n$^+$ type semiconductor region 5n inside the protective chip 5ZB.

Consequently, even if the protective chip 5ZB is mounted in an inclined manner and a back surface corner of the protective chip 5ZB is electrically coupled to the wiring 3a, no problem occurs with the electrical characteristics of the protective element ZN. Therefore, as shown in FIG. 15, the forward electrical characteristic curve of this structure coincides with the good forward electrical characteristic curve (solid line FLs) and as shown in FIG. 16, the reverse electrical characteristic curve (dotted line RL) of this structure almost coincides with the good reverse electrical characteristic curve (dotted line RLs).

Figure 17:
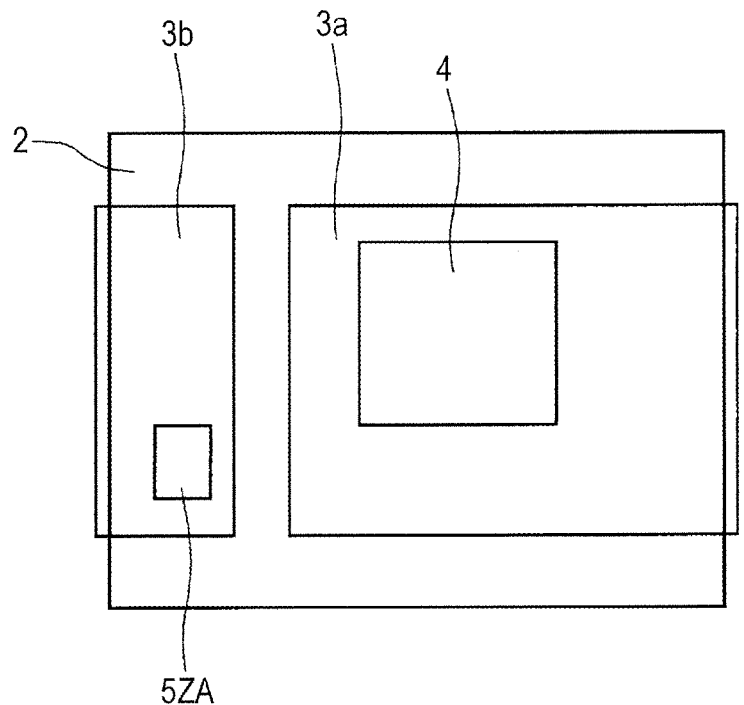
FIG. 17 is a plan view of a package substrate at a step in the process of manufacturing a semiconductor device which uses the surface protective chip shown in FIG. 6.
Figure 18:
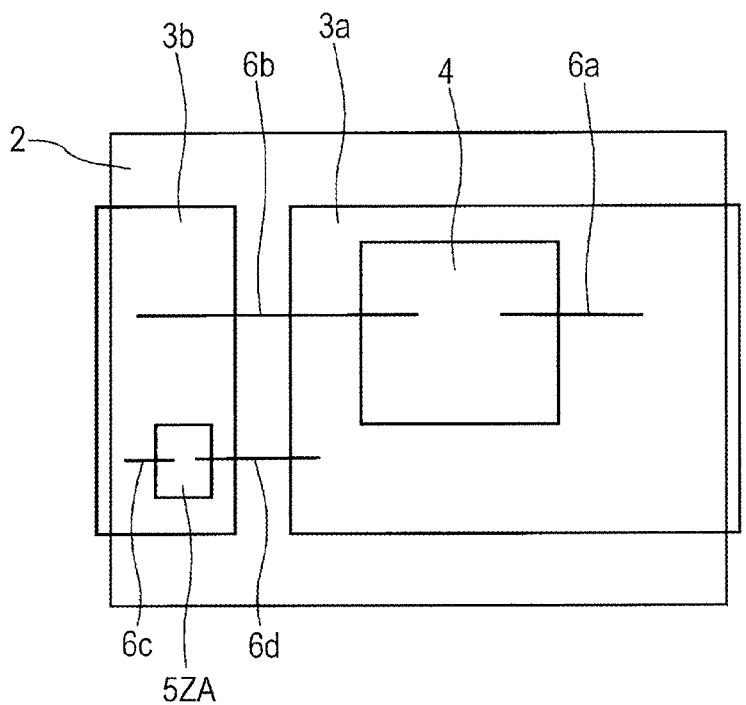
FIG. 18 is a plan view of the package substrate at a step subsequent to the step shown in FIG. 17 in the process of manufacturing a semiconductor device.
Figure 19:
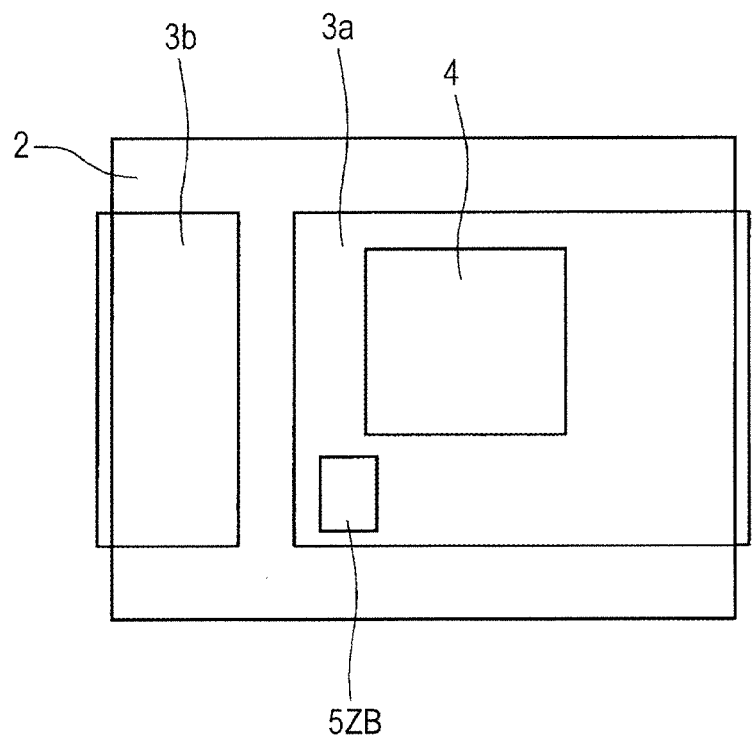
FIG. 19 is a plan view of a package substrate at a step in the process of manufacturing a semiconductor device which uses the surface protective chip shown in FIG. 14.
Figure 20:
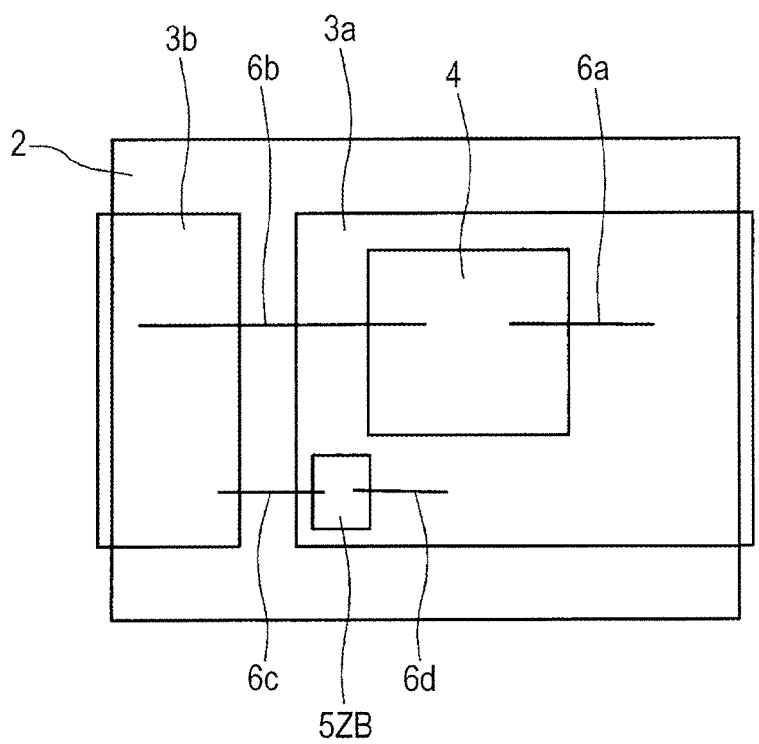
FIG. 20 is a plan view of the package substrate at a step subsequent to the step shown in FIG. 19 in the process of manufacturing a semiconductor device.

Next, the method of manufacturing the semiconductor device 1 according to the first embodiment will be described referring to FIGS. 17 to 20. FIGS. 17 and 18 are plan views of the package substrate 2 in the process of manufacturing the semiconductor device 1 which uses the protective chip 5ZA shown in FIG. 6 and FIGS. 19 and 20 are plan views of the package substrate 2 in the process of manufacturing the semiconductor device 1 which uses the protective chip 5ZB shown in FIG. 14.

First, the process of manufacturing the semiconductor device which uses the protective chip 5ZA shown in FIG. 6 will be explained. As shown in FIG. 17, the light emitting chip 4 is mounted over the wiring 3a on the main surface of the package substrate 2. The protective chip 5ZA is mounted over the wiring 3b on the main surface of the package substrate 2.

In order to mount the light emitting chip 4, for example, an adhesive agent of silicone resin is used and if a vertical protective chip is employed, Ag paste is used as an adhesive agent for the protective chip, so two kinds of adhesive agents must be prepared and different coating steps are required. This would lead to increased complexity of the semiconductor device manufacturing process. By contrast, this embodiment uses the same insulating adhesive agent for both the light emitting chip 4 and protective chip 5ZA, so the semiconductor device manufacturing process is simplified.

Next, as shown in FIG. 18, the light emitting chip 4 and protective chip 5ZA are electrically coupled to the wirings 3a and 3b through metal wires 6a to 6d. In the case of the protective chip 5ZA, the anode electrode electrically coupled to the wiring 3b through the metal wire 6c is electrically coupled to the back surface of the protective chip 5ZA without PN junction inside the protective chip 5ZA, so even if a back surface corner of the protective chip 5ZA mounted over the wiring 3b in an inclined manner is in contact with the wiring 3b, no problem occurs with the electrical characteristics of the protective chip 5ZA and protective element ZN.

Then, after a reflector 7 (see FIG. 3) is bonded to the main surface of the package substrate 2 with its reflecting surface up, the light emitting chip 4 and protective chip 5ZA are sealed with sealing resin 8 (see FIG. 3) to produce the semiconductor device 1 as shown in FIGS. 2 and 3.

Secondly, the process of manufacturing the semiconductor device which uses the protective chip 5ZB shown in FIG. 14 will be explained. As shown in FIG. 19, the light emitting chip 4 and protective chip 5ZB are mounted over the wiring 3a on the main surface of the package substrate 2. In this case as well, the same insulating adhesive agent is used to mount both the light emitting chip 4 and protective chip 5ZB, so the semiconductor device manufacturing process is simplified.

Next, as shown in FIG. 20, the light emitting chip 4 and protective chip 5ZB are electrically coupled to the wirings 3a and 3b through metal wires 6a to 6d. In the case of the protective chip 5ZB, the cathode electrode electrically coupled to the wiring 3a through the metal wire 6d is electrically coupled to the back surface of the protective chip 5ZB without PN junction inside the protective chip 5ZB. Therefore, even if a back surface corner of the protective chip 5ZB mounted over the wiring 3a in an inclined manner is in contact with the wiring 3a, no problem occurs with the electrical characteristics of the protective chip 5ZB and protective element ZN.

Then, after the reflector 7 is bonded to the main surface of the package substrate 2 and the sealing step with sealing resin 8 is carried out to produce the semiconductor device 1 as shown in FIGS. 2 and 3.

Second Embodiment

Figure 21:
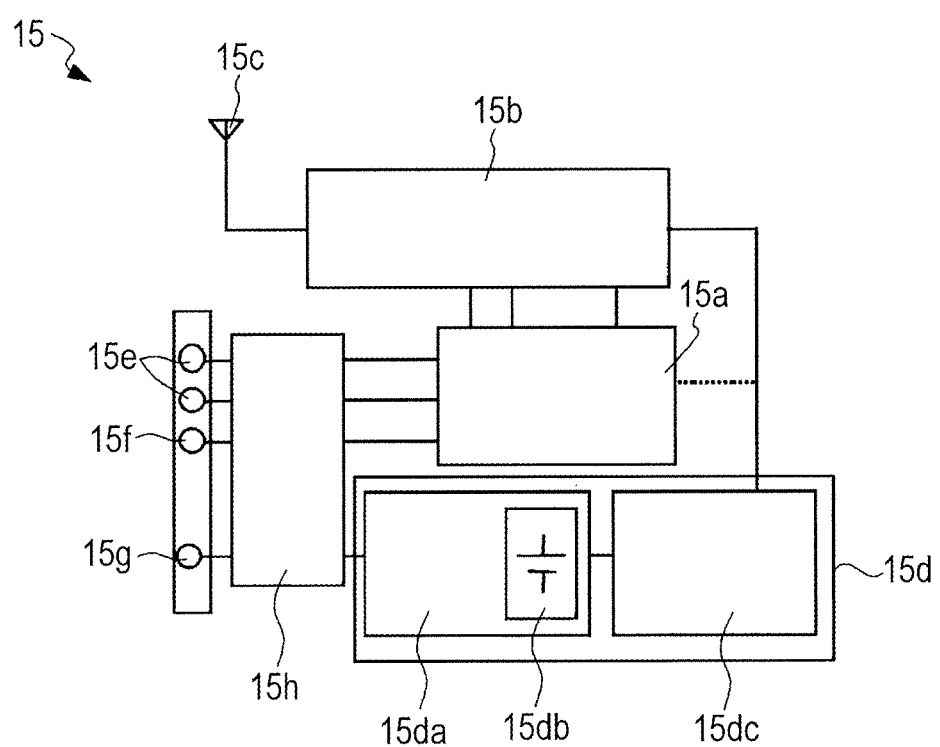
FIG. 21 is a circuit diagram of a mobile phone external interface as a semiconductor device according to a second embodiment of the present invention.

FIG. 21 is a circuit diagram of a mobile phone external interface (semiconductor device) 15 according to the second embodiment.

The mobile phone external interface 15 according to the second embodiment includes a baseband circuit (electronic component) 15a, a radio-frequency signal processing circuit 15b, an antenna 15c, a power supply circuit (electronic component) 15d, a plurality of terminals 15e to 15g, and a protective circuit 15h.

The baseband circuit 15a is a circuit which deals with an unmodulated or demodulated baseband signal and is electrically coupled to the antenna 15c through the radio-frequency signal processing circuit 15b. The radio-frequency signal processing circuit 15b is a circuit which deals with a signal in the electromagnetic wave band and modulates a baseband signal to a predetermined band (RF band) at the time of transmission and demodulates the signal in the predetermined band to the baseband at the time of reception. The antenna 15c is an electronic component which receives an electromagnetic wave and converts it into an electric signal and converts an electric signal into an electromagnetic wave.

The power supply circuit 15d supplies supply voltage to the baseband circuit 15a and radio-frequency signal processing circuit 15b and so on and includes a storage battery for charging 15da, a battery charging switching circuit 15db, and a power control circuit 15dc.

The protection circuit 15h protects the baseband circuit 15a and power supply circuit 15d from surge voltage and is electrically coupled between the terminals 15e to 15g and the baseband circuit 15a and power supply circuit 15d. Terminals 15e are terminals for various signals, terminal 15f is an operation signal terminal, and terminal 15g is a power supply terminal for DC voltage supply.

Figure 22:
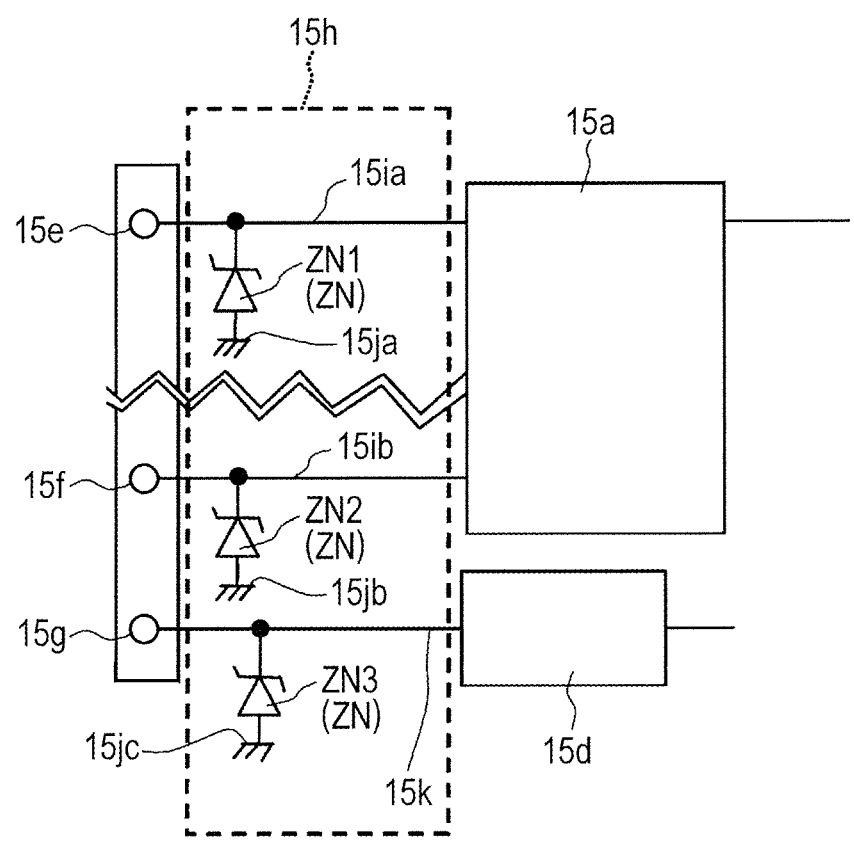
FIG. 22 is a circuit diagram of the protective circuit of the mobile phone external interface shown in FIG. 21.

FIG. 22 is a circuit diagram of the protective circuit 15h of the mobile phone external interface 15 shown in FIG. 21.

The protective circuit 15h includes a plurality of protective elements ZN1 to ZN3 (ZN). The protective elements ZN1 to ZN3 are each a surface Zener diode as mentioned above.

The protective element ZN1 is electrically coupled between a wiring for signals (first wiring) 15ia and a grounding wiring (second wiring) 15ja. The anode electrode of the protective element ZN1 is electrically coupled to the grounding wiring 15ja and its cathode electrode is electrically coupled to the wiring for signals 15ia. The wiring for signals 15ia is used to couple the terminal for signals 15e to the baseband circuit 15a electrically and corresponds to the wiring 3a mentioned above. The grounding wiring 15ja corresponds to the wiring 3b.

The protective element ZN2 is electrically coupled between a wiring for operation signals (first wiring) 15ib and a grounding wiring (second wiring) 15jb. The anode electrode of the protective element ZN2 is electrically coupled to the grounding wiring 15jb and its cathode electrode is electrically coupled to the wiring for operation signals 15ib. The wiring for operation signals 15ib is used to couple the terminal for operation signals 15f to the baseband circuit 15a electrically and corresponds to the wiring 3a. The grounding wiring 15jb corresponds to the wiring 3b.

The protective element ZN3 is electrically coupled between a wiring for power supply (first wiring) 15k and a grounding wiring (second wiring) 15jc. The anode electrode of the protective element ZN3 is electrically coupled to the grounding wiring 15jc and its cathode electrode is electrically coupled to the wiring for power supply 15k. The wiring for power supply 15k is a high-potential side power supply wiring which electrically couples the grounding terminal 15g to the power supply circuit 15d and corresponds to the wiring 3a. The grounding wiring 15jc corresponds to the wiring 3b.

In the second embodiment, the protective elements ZN1 to ZN3 (ZN) have the structure of the protective chip 5ZA or 5ZB (see FIGS. 12 and 14 and so on). If the protective elements ZN1 to ZN3 (ZN) have the structure of the protective chip 5ZA, their protective chips 5ZA are mounted over the grounding wirings 15ja to 15jc respectively. On the other hand, if the protective elements ZN1 to ZN3 have the structure of the protective chip 5ZB, their protective chips 5ZB are mounted over the grounding wirings 15ia, 15ib, and 15k respectively.

According to the second embodiment, the protective circuit 15h protects the baseband circuit 15a and power supply circuit 15d from surge voltage.

In addition, since the insulating film 59 (see FIG. 7 and so on) for prevention of contact is not formed on the back surface of the protective chip 5ZA or 5ZB, it is easier to produce the protective chip 5ZA or 5ZB. Also it is unnecessary to make concaves in the wirings 15ia, 15ib, 15k, and 15ja to 15jc to decrease the main surface height of the protective chip 5ZA or 5ZB in order to achieve the desired thinness of the mobile phone external interface 15. Consequently, the mobile phone external interface 15 can be manufactured more easily.

In addition, since the resin bonding layer 9 well adheres to Si and the back surface (Si) of the protective chip 5ZA or 5ZB is in direct contact with the bonding layer 9, the possibility that the protective chip 5ZA or 5ZB might peel (mounting failure) is reduced. Therefore, the reliability of the mobile phone external interface 15 is improved.

Furthermore, since the bonding layer 9 (see FIGS. 11 and 13) on the back surface of the protective chip 5ZA or 5ZB can be thinner than the Ag paste, the main surface height of the protective chip 5ZA or 5ZB can be smaller than the main surface height of the protective chip 55ZV with a vertical Zener diode (see FIG. 25 and so on).

Due to the absence of the insulating film 59 for prevention of contact (see FIG. 7 and so on) on the back surface of the protective chip 5ZA or 5ZB, the main surface height of the protective chip 5ZA or 5ZB can be smaller than that of the protective chip with a surface Zener diode which has the insulating film 59 for prevention of contact on its back surface.

Furthermore, since a contact failure of the back surface attributable to the inclination of the protective chip 5ZA or 5ZB is tolerable, the thickness of a wafer used to make a protective chip can be decreased. For this reason, the main surface height of the protective chip 5ZA or 5ZB can be further decreased.

Third Embodiment

Figure 23:
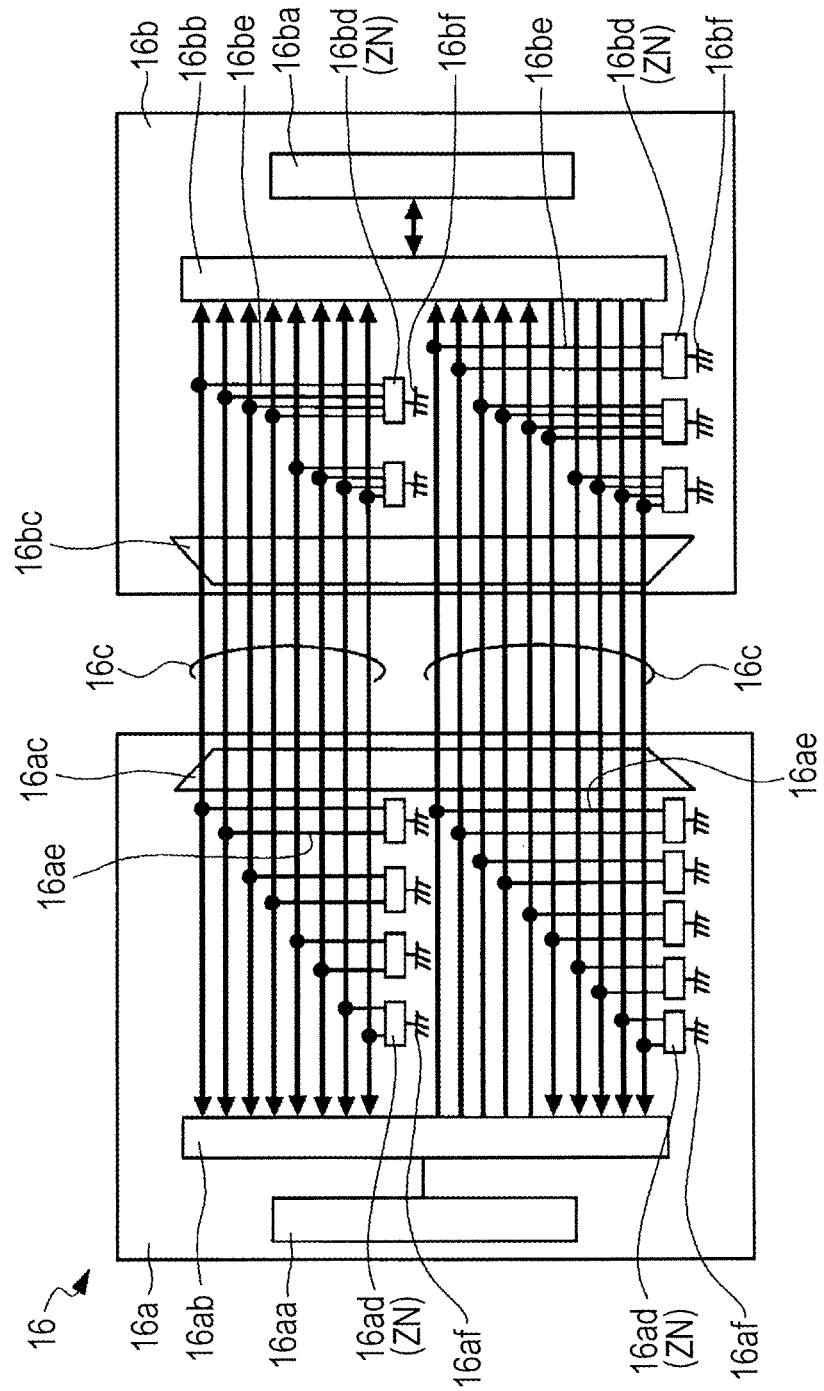
FIG. 23 is a circuit diagram of a PC peripheral device as a semiconductor device according to a third embodiment of the present invention.

FIG. 23 is a circuit diagram of a PC peripheral device (semiconductor device) 16 according to the third embodiment.

The PC peripheral device 16 according to the third embodiment includes a host PC circuit 16a, a peripheral circuit 16b, and a plurality of data lines 16c which couple them electrically.

The host PC circuit 16a includes a microcomputer circuit (electronic component) 16aa, an interface circuit (electronic component) 16ab, a connector 16ac, a plurality of protective circuits 16ad, and a plurality of wirings (first wirings) 16ae and grounding wirings (second wirings) 16af.

The peripheral circuit 16b includes a microcomputer circuit (electronic component) 16ba, an interface circuit (electronic component) 16bb, a connector 16bc, a plurality of protective circuits 16bd, and a plurality of wirings (first wirings) 16be and grounding wirings (second wirings) 16bf.

The microcomputer circuit 16aa of the host PC circuit 16a is electrically coupled to the data lines 16c through the interface circuit 16ab and also electrically coupled to the connector 16ac through the data lines 16c. The connector 16ac is electrically coupled to the connector 16bc of the peripheral circuit 16b through the data lines 16c.

The connector 16bc of the peripheral circuit 16b is electrically coupled to the interface circuit 16bb of the peripheral circuit 16b through the data lines 16c and also electrically coupled to the microcomputer circuit 16ba of the peripheral circuit 16b.

The protective circuits 16ad (16bd) are electrically coupled between the wirings (first wirings) 16ae (16be) and the grounding wirings (second wirings) 16af (16bf). The wirings 16ae and 16be are electrically coupled to the data lines 16c and correspond to the wiring 3a. The grounding wirings 16af and 16bf correspond to the wiring 3b.

The protective circuits 16ad and 16bd include the abovementioned protective elements ZN and each protective element ZN includes the abovementioned surface Zener diode. The anode electrodes of the protective elements ZN are electrically coupled to the grounding wirings 16af and 16bf and their cathode electrodes are electrically coupled to the wirings 16ae and 16be for the data lines.

In the third embodiment as well, the protective elements ZN have the same structure as the protective chip 5ZA or 5ZB (see FIGS. 12 and 14 and so on) as mentioned above. If each protective element ZN structurally includes the protective chip 5ZA, the protective chip 5ZA is mounted over the grounding wiring 16af or 16bf. If each protective element ZN structurally includes the protective chip 5ZB, the protective chip 5ZB is mounted over the wiring 16ae or 16be for the data line.

The third embodiment brings about the same effect as the second embodiment.

Fourth Embodiment

Figure 24:
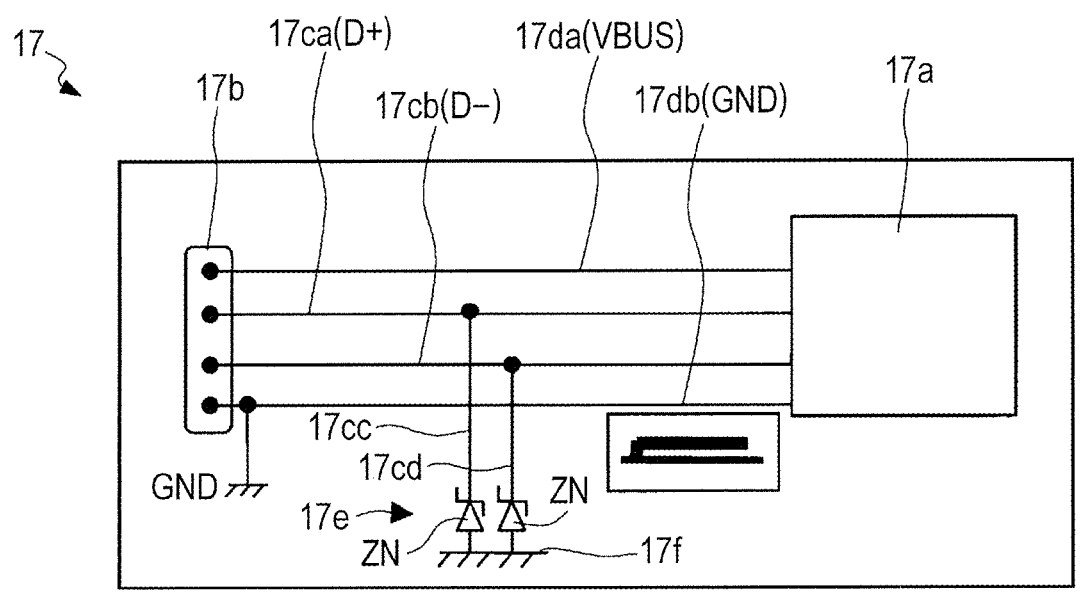
FIG. 24 is a circuit diagram of a USB device as a semiconductor device according to a fourth embodiment of the present invention.

FIG. 24 is a circuit diagram of a USB (Universal Serial Bus) device (semiconductor device) 17 according to the fourth embodiment.

The USB device 17 according to the fourth embodiment includes a USB device main circuit (electronic component) 17a, a USB connector 17b, differential signal lines 17ca (D+) and 17cb (D−), a high-potential power supply wiring 17da (VBUS) and a grounding wiring 17db (GND), and a protective circuit 17e.

The USB device main circuit 17a may be a semiconductor memory, digital camera, printer or scanner.

The protective circuit 17e is electrically coupled between wirings (first wirings) 17cc and 17cd and a grounding wiring (second wiring) 17f. The wirings 17cc and 17cd are electrically coupled to the differential signal lines 17ca and 17cb respectively and correspond to the wiring 3a. The grounding wiring 17f corresponds to the wiring 3b.

The protective circuit 17e includes the protective elements ZN as mentioned above and each of the protective elements includes the surface Zener diode as mentioned above. The anode electrodes of the protective elements ZN are electrically coupled to the grounding wiring 17f and their cathode electrodes are electrically coupled to the wirings 17cc and 17cd for the differential signal lines respectively.

In the fourth embodiment as well, the protective elements ZN have the same structure as the protective chip 5ZA or 5ZB (see FIGS. 12 and 14 and so on) as mentioned above. If each protective element ZN structurally includes the protective chip 5ZA, the protective chip 5ZA is mounted over the grounding wiring 17f. If each protective element ZN structurally includes the protective chip 5ZB, the protective chip 5ZB is mounted over the wiring 17cc or 17cd.

The fourth embodiment brings about the same effect as the second and third embodiments.

The invention made by the present inventors has been so far concretely explained in reference to the preferred embodiments thereof. However, the invention is not limited to the above embodiments and it is obvious that these details may be modified in various ways without departing from the spirit and scope of the invention.

The above first to fourth embodiments assume that the protective element ZN is a Zener diode. However the invention is not limited thereto and for example, the protective element may be a PN junction diode.

What is claimed is:

1. A semiconductor device comprising:
   a package substrate;
   a first wiring and a second wiring electrically isolated from each other and formed on the package substrate;
   an electronic component electrically coupled between the first wiring and the second wiring and mounted on the first wiring;
   a semiconductor chip including a Zener diode electrically coupled in parallel to the electronic component between the first wiring and the second wiring to protect the electronic component and having a first surface and a second surface on a back thereof with an anode electrode and a cathode electrode of the Zener diode located on the first surface; and
   a resin bonding layer formed between the second wiring and the second surface,
   wherein the semiconductor chip includes:
   a p-type semiconductor substrate;
   a p-type anode region formed in the semiconductor substrate of the first surface side;
   an n-type cathode region formed in the semiconductor substrate of the first surface side;
   the anode electrode formed on the anode region; and
   the cathode electrode formed on the cathode region,
   wherein the electronic component is connected to the first wiring through a first metal wire and is connected to the second wiring through a second metal wire, and
   wherein the semiconductor chip is connected to the second wiring through a third metal wire and is connected to the first wiring through a fourth metal wire.

2. The semiconductor device according to claim 1,
   wherein the first and second wirings are formed of copper, respectively.

3. The semiconductor device according to claim 1,
   wherein the electronic component is a light emitting diode; and
   the Zener diode is coupled in a reverse direction with respect to the light emitting diode.

4. The semiconductor device according to claim 3,
   wherein the electronic component and the semiconductor chip are sealed with resin and has a reflector over a main surface of the package substrate.

5. The semiconductor device according to claim 4,
   wherein the reflector is made of aluminum or ceramic.

6. The semiconductor device according to claim 4,
   wherein the reflector is located on a periphery of the main surface of the package substrate.

7. A method of manufacturing a semiconductor device comprising the steps of:
   (a) providing a semiconductor chip including a Zener diode for protecting an electronic component and having a first surface and a second surface on a back thereof with an anode electrode and a cathode electrode of the Zener diode located on the first surface;
   (b) mounting the semiconductor chip over one wiring of a first wiring and a second wiring being electrically isolated from each other with the second surface facing the one wiring, a resin bonding layer being formed between the second wiring and the second surface;
   (c) electrically coupling the electronic component between the first wiring and the second wiring; and
   (d) electrically coupling the anode electrode and the cathode electrode of the semiconductor chip to the first wiring and the second wiring so as to couple the Zener diode in parallel to the electronic component electrically,
   wherein the semiconductor chip includes:
   a p-type semiconductor substrate;
   a p-type anode region formed in the semiconductor substrate of the first surface side;
   an n-type cathode region formed in the semiconductor substrate of the first surface side;
   the anode electrode formed on the anode region; and
   the cathode electrode formed on the cathode region,
   wherein the electronic component is connected to the first wiring through a first metal wire and is connected to the second wiring through a second metal wire, and
   wherein the semiconductor chip is connected to the second wiring through a third metal wire and is connected to the first wiring through a fourth metal wire.

8. The method of manufacturing a semiconductor device according to claim 7,
   wherein the first and second wirings are formed of copper, respectively.

9. The method of manufacturing a semiconductor device according to claim 7,
   wherein the electronic component is a light emitting diode; and
   the Zener diode is coupled in a reverse direction with respect to the light emitting diode.

10. The method of manufacturing a semiconductor device according to claim 9,
    wherein the electronic component and the semiconductor chip are sealed with resin and has a reflector over a main surface of the package substrate.

11. The method of manufacturing a semiconductor device according to claim 10,
    wherein the reflector is made of aluminum or ceramic.

12. The method of manufacturing a semiconductor device according to claim 10,
wherein the reflector is located on a periphery of the main surface of the package substrate.

* * * * *